US009922802B2

(12) United States Patent
Hirano et al.

(10) Patent No.: US 9,922,802 B2
(45) Date of Patent: Mar. 20, 2018

(54) POWER SUPPLY SYSTEM, PLASMA ETCHING APPARATUS, AND PLASMA ETCHING METHOD

(71) Applicant: Tokyo Electron Limited, Tokyo (JP)

(72) Inventors: Taichi Hirano, Miyagi (JP); Fumitoshi Kumagai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 370 days.

(21) Appl. No.: 14/376,697

(22) PCT Filed: Feb. 19, 2013

(86) PCT No.: PCT/JP2013/053998
§ 371 (c)(1),
(2) Date: Aug. 5, 2014

(87) PCT Pub. No.: WO2013/125523
PCT Pub. Date: Aug. 29, 2013

(65) Prior Publication Data
US 2015/0000842 A1    Jan. 1, 2015

Related U.S. Application Data

(60) Provisional application No. 61/605,925, filed on Mar. 2, 2012.

(30) Foreign Application Priority Data

Feb. 20, 2012  (JP) ................................ 2012-034468

(51) Int. Cl.
    *H01J 37/32*        (2006.01)
    *H05H 1/46*         (2006.01)
    (Continued)

(52) U.S. Cl.
    CPC ........ *H01J 37/32045* (2013.01); *G05B 11/01* (2013.01); *H01J 37/32027* (2013.01);
    (Continued)

(58) Field of Classification Search
    CPC ................ G05B 11/01; H01J 37/32045; H01J 37/32027; H01J 37/32935;
    (Continued)

(56) References Cited

U.S. PATENT DOCUMENTS 5,665,167 A * 9/1997 Deguchi ................. C23C 14/50
                                                    118/723 E
2011/0100807 A1* 5/2011 Matsubara .......... C23C 14/3464
                                                    204/298.08

FOREIGN PATENT DOCUMENTS

JP    2000-173993 A      6/2000
JP    2003516691 A   *   5/2003
(Continued)

OTHER PUBLICATIONS

International Search Report for PCT/JP2013/053998 dated May 21, 2013.

*Primary Examiner* — Yuechuan Yu
(74) *Attorney, Agent, or Firm* — Pearne & Gordon LLP

(57) ABSTRACT

A power supply system 90 includes high frequency power supplies 92 and 93 that supply a high frequency power for plasma generation; a DC power supply 91 that supplies a DC voltage to be applied to an electrode; and control unit 94 that controls the high frequency power supplies 92 and 93 and the DC power supply 91 including a first DC power supply unit 101 that supplies a first negative DC voltage V1, a second DC power supply unit 102 that supplies a second negative DC voltage V2 having a higher absolute value than the first negative DC voltage V1, and a selecting circuit 103 that selectively connects the first DC power supply unit 101 and the second DC power supply unit 102 to the electrode;

(Continued)

and a discharging circuit 104 connected with a node 109 between the first DC power supply unit 101 and the selecting circuit 103.

11 Claims, 18 Drawing Sheets

(51) Int. Cl.
    *H01L 21/311*     (2006.01)
    *G05B 11/01*     (2006.01)
    *H01L 21/768*     (2006.01)

(52) U.S. Cl.
    CPC .. *H01J 37/32091* (2013.01); *H01J 37/32935* (2013.01); *H01L 21/31116* (2013.01); *H01L 21/31144* (2013.01); *H01L 21/76802* (2013.01); *H05H 1/46* (2013.01); *H01J 2237/06* (2013.01); *H01J 2237/3343* (2013.01); *H05H 2001/4682* (2013.01); *Y10T 307/367* (2015.04)

(58) Field of Classification Search
    CPC ............. H01J 37/32091; H01J 2237/06; H01J 2237/3343; H05H 1/46; H05H 2001/4682; H01L 21/31116; H01L 21/31144; H01L 21/76802; Y10T 307/367
    See application file for complete search history.

(56) References Cited

FOREIGN PATENT DOCUMENTS

| JP | 2006-270019 A | 10/2006 |
| JP | 2010-171320 A | 8/2010 |
| JP | 2010-219491 A | 9/2010 |

\* cited by examiner

FIG. 18

| | CONTROL SIGNAL C1, C2, C5 | | FIRST HIGH FREQUENCY POWER | | SECOND HIGH FREQUENCY POWER | | FIRST DC VOLTAGE (V) | SECOND DC VOLTAGE (V) | PRESSURE WITHIN PROCESSING CHAMBER (mT) | PROCESSING GAS FLOW RATE | | | PROCESSING TIME (s) | SELECTIVITY |
|---|---|---|---|---|---|---|---|---|---|---|---|---|---|---|
| | FREQUENCY (kHz) | DUTY RATIO (%) | RF FREQUENCY (MHz) | POWER (W) | RF FREQUENCY (MHz) | POWER (W) | | | | $C_4F_6$ | Ar | $O_2$ | | |
| EXPERIMENTAL EXAMPLE 5 | 10 | 80 | 40 | 1500 | 3 | 7800 | 200 | 900 | 15 | 100 | 100 | 120 | 150 | 3.7 |
| EXPERIMENTAL EXAMPLE 6 | 20 | 80 | 40 | 1500 | 3 | 7800 | 200 | 900 | 15 | 100 | 100 | 120 | 150 | 3.9 |
| EXPERIMENTAL EXAMPLE 7 | 30 | 80 | 40 | 1500 | 3 | 7800 | 200 | 900 | 15 | 100 | 100 | 120 | 150 | 3.9 |
| EXPERIMENTAL EXAMPLE 8 | 40 | 80 | 40 | 1500 | 3 | 7800 | 200 | 900 | 15 | 100 | 100 | 120 | 150 | 4.4 |

POWER SUPPLY SYSTEM, PLASMA ETCHING APPARATUS, AND PLASMA ETCHING METHOD

CROSS-REFERENCE TO RELATED APPLICATION

This Application is a U.S. national phase application under 35 U.S.C. § 371 of PCT Application No. PCT/JP2013/053998 filed on Feb. 19, 2013, which claims the benefit of Japanese Patent Application No. 2012-034468 filed on Feb. 20, 2012, and U.S. Provisional Application Ser. No. 61/605,925 filed on Mar. 2, 2012, the entire disclosures of which are incorporated herein by reference.

TECHNICAL FIELD

The embodiments described herein pertain generally to a power supply system, a plasma etching apparatus, and a plasma etching method.

BACKGROUND

In a semiconductor device manufacturing process, a plasma etching process has been used to form a pattern on a layer formed on a semiconductor wafer serving as a target substrate. In the plasma etching process, the layer on the semiconductor wafer is etched by plasma with a resist as a mask.

Various plasma etching apparatuses have been used to perform such a plasma etching process. Currently, a capacitively coupled parallel plate type plasma etching apparatus is mainly used as a plasma etching apparatus.

In the capacitively coupled parallel plate type plasma etching apparatus, a pair of parallel plate electrodes, i.e., an upper electrode and a lower electrode, are provided within a processing chamber. A processing gas is supplied into the processing chamber, and a high frequency (RF) power is applied to at least one of the upper electrode and the lower electrode, so that a high frequency electric field is formed between these electrodes. The processing gas is excited into plasma by this high frequency electric field, and the layer on the semiconductor wafer is etched by the plasma.

As a capacitively coupled parallel plate type plasma etching apparatus, for example, a plasma etching apparatus described in Patent Document 1 has been known. This plasma etching apparatus applies a high frequency power for plasma generation having a frequency in a range of 50 MHz to 500 MHz and a high frequency power for ion attraction having a frequency in a range of 1 MHz to 4 MHz to a mounting electrode. Thus, an etching process can be carried out with high selectivity and high reproducibility. In this kind of an etching process, the etching process is carried out by using a processing gas in which positive ions predominate in the plasma.

In an etching process used in the semiconductor device manufacturing process, there has been a demand for improvement in aspect ratio to perform a process in a deeper and narrower pattern. Recently, there has been a demand for an etching process having a high aspect ratio such as HARC (High Aspect Ratio Contact) etching process which has an aspect ratio of 20 or more or a next-generation HARC etching process in which a deep trench having an aspect ratio of 40 or more can be formed.

In such a HARC etching process, if the aspect ratio is increased as the etching process progresses, positive ions are accumulated at the bottom of a hole, and, thus, an etching surface becomes positively charged. When the etching surface is positively charged, the positive ions important in accelerating the etching process cannot move straight within the hole. As a result, an etching profile may be curved or deformed. Further, as the bottom of the hole is positively charged, shading damage may be caused. Furthermore, since it becomes difficult for the positive ions to reach the bottom of the hole, an etching rate may be deteriorated. Therefore, in order to form a hole having a high aspect ratio, there has been a need for improving the conventional plasma etching apparatus.

A plasma etching apparatus satisfying the need for improvement is described in Patent Document 2. In the plasma etching apparatus described in Patent Document 2, a high frequency power supply configured to generate high frequency power for plasma generation is turned on and off on a certain cycle. Further, this plasma etching apparatus applies a negative DC voltage to an upper electrode during the on/off-period of the high frequency power supply. During the off-period of the high frequency power supply, plasma is reduced, and, thus, negative ions accelerated by the DC voltage applied to the upper electrode are introduced into the bottom of the hole, and positive charges within the hole are neutralized. After the positive charges within the hole are neutralized, if the high frequency power supply is turned on and plasma is generated, positive ions can move straight within the hole. Therefore, according to this plasma etching apparatus, a desirable etching profile can be obtained.

Further, in an etching process used in the semiconductor device manufacturing process, there has been a demand for fine pattern. In order to satisfy such a demand, an ArF photoresist, which is exposed by a laser beam with a short-wavelength ArF gas as a light emitting source, has been used as an etching mask. In the etching mask using the ArF photoresist, an opening pattern of, for example, about 0.13 µm or less may be formed.

However, since the ArF photoresist has a low plasma resistance, a surface may become rough during the etching process. Thus, vertical lines (striation) may be formed on an inner wall surface of the opening pattern, or the opening pattern may be expanded (expansion in CD). Therefore, there has been a need for improving the etching selectivity.

A plasma etching apparatus satisfying the need for improvement is described in Patent Document 3. In the plasma etching apparatus described in Patent Document 3, a negative DC voltage is applied to an upper electrode. If the negative DC voltage is applied to the upper electrode, when plasma is generated, electrons are generated around the upper electrode. These electrons are accelerated in a direction toward a target substrate on which an ArF photoresist is formed by a potential difference between a potential of the upper electrode and a potential of the plasma. If the electrons are irradiated to the ArF photoresist, a polymer structure of the ArF photoresist is changed and an etching resistance is increased, so that the etching selectivity is increased.

However, a modification (reforming) effect on an organic mask caused by irradiating the electrons depends on a thickness of a plasma sheath on the target substrate. That is, if a thick plasma sheath is formed on the target substrate, the electrons are reflected from the plasma sheath and an electron irradiation amount is decreased. Therefore, in order to modify an organic mask, there has been a need for increasing electrons to be irradiated to the organic mask.

A plasma etching apparatus satisfying the need for the increasing is described in Patent Document 4. In the plasma etching apparatus described in Patent Document 4, a high frequency power supply is turned on and off on a certain cycle. Further, this plasma etching apparatus includes a DC power supply unit including a first DC power supply unit configured to generate a first negative DC voltage and a second DC power supply unit configured to generate a second negative DC voltage having a higher absolute value than that of the first DC voltage. Further, during the on-period of the high frequency power supply, the first DC power supply unit is connected to an upper electrode. Furthermore, in this plasma etching apparatus, during the off-period of the high frequency power supply, plasma is reduced and a plasma sheath becomes thin. During this period, a negative DC voltage having a relatively high absolute value is applied to the upper electrode, so that more electrons are irradiated to an organic mask. Therefore, according to the plasma etching apparatus described in Patent Document 4, a modification effect on the organic mask can be further improved.

REFERENCES

Patent Document 1: Japanese Patent Laid-open Publication No. 2000-173993
Patent Document 2: Japanese Patent Laid-open Publication No. 2010-171320
Patent Document 3: Japanese Patent Laid-open Publication No. 2006-270019
Patent Document 4: Japanese Patent Laid-open Publication No. 2010-219491

DISCLOSURE OF THE INVENTION

Problems to be Solved by the Invention

In order to form a hole having a higher aspect ratio than a hole formed by the plasma etching apparatus described in Patent Document 4, it is necessary to further improve an organic mask modification effect by irradiating more electrons to the organic mask. In order to increase the amount of electrons to be irradiated to the organic mask, a frequency of repeating application of high frequency power and stop of the application and a frequency of switching a DC power supply unit connected with an upper electrode between a first DC power supply unit and a second DC power supply unit in synchronization therewith may be considered to be high. However, due to the effect of the high frequencies, when the DC power supply unit connected with the upper electrode is switched from the second DC power supply unit to the first DC power supply unit, an output voltage of the DC power supply cannot be controlled to be a first DC voltage. Thus, plasma within a processing chamber can be unstable.

Therefore, in this technical field, an output voltage of a DC power supply needs to be followed by a switching of negative DC voltages different in absolute value and applied to an upper electrode of a parallel plate type plasma etching apparatus at a high frequency.

Means for Solving the Problems

In accordance with one aspect, a power supply system is used in a plasma etching apparatus in which a lower electrode included in a mounting table that mounts a target substrate thereon and an upper electrode facing the lower electrode are provided within a processing chamber. The power supply system includes a high frequency power supply which is electrically connected with the lower electrode and configured to generate a high frequency power for plasma generation; a DC power supply, configured to apply an output voltage as a negative DC voltage to the upper electrode, having a first DC power supply unit configured to supply a first negative DC voltage, a second DC power supply unit configured to supply a second negative DC voltage having a higher absolute value than that of the first negative DC voltage, and a selecting circuit configured to selectively connect the first DC power supply unit and the second DC power supply unit to the upper electrode; and a control unit configured to control the high frequency power supply and the DC power supply. The control unit is configured to alternately repeat an output of the high frequency power and a stop of the output thereof at a certain frequency by outputting a first control signal to the high frequency power supply, and the control unit is configured to connect the first DC power supply unit to the upper electrode during a period where the high frequency power is outputted and connect the second DC power supply unit to the upper electrode during a period where the output of the high frequency power is stopped by outputting a second control signal to the DC power supply. The DC power supply further includes a discharging circuit connected with a node between the first DC power supply unit and the selecting circuit.

In this power supply system, when the power supply unit connected with the upper electrode is switched from the second DC power supply unit to the first DC power supply unit, electrons accumulated in the processing chamber are rapidly discharged through the discharging circuit. Thus, when the power supply unit connected with the upper electrode is switched from the second DC power supply unit to the first DC power supply unit, the output voltage of the DC power supply is rapidly controlled to the first DC voltage. Therefore, even if a cycle of switching negative DC voltages different in absolute value and applied to the upper electrode is shortened, the output voltage of the DC power supply can be followed. As such, the shortened cycle of switching DC voltages can be followed by the output voltage of the DC power supply, and, thus, more electrons can be efficiently irradiated to an organic mask on the target substrate. As a result, a further improvement in a modification effect on the organic mask can be achieved.

In an example embodiment, the DC power supply may further include a switch circuit provided between the discharging circuit and the node. In accordance with this example embodiment, by controlling the switch circuit, the discharging circuit can be electrically disconnected from the node. This example embodiment can be applied, for example, when a constant DC voltage is applied to the upper electrode.

In an example embodiment, the discharging circuit may include a resistance element. Further, in another example embodiment, the discharging circuit may serve as a current limiting circuit configured to limit a value of a current flowing through the resistance element. In accordance with this example embodiment, since an amount of a current consumed caused by a flow of electrons is limited, it is possible to reduce an amount of power required for the DC power supply device, and, thus, power can be efficiently supplied.

In an example embodiment, the first control signal may be a pulse signal configured to switch between the output of the high frequency power and the stop of the output thereof. Further, the second control signal may be a pulse signal configured to switch the DC power supply unit connected with the upper electrode between the first DC power supply unit and the second DC power supply unit. The control unit may be configured to control frequencies and duty ratios of the first control signal and the second control signal and configured to control a phase difference between the first control signal and the second control signal. In accordance with this example embodiment, by changing the frequencies of the first and second control signals or by changing the phase difference between the first control signal and the second control signal, an amount of electrons to be irradiated to the target substrate can be controlled. Therefore, in accordance with this example embodiment, electrons in an optimum amount of electrons, which depends on an etching status of the target substrate, can be irradiated to an etching mask on the target substrate.

In an example embodiment, the control unit may be configured to monitor the first control signal and the second control signal outputted from the control unit, and the control unit may be configured to stop the outputs of the first control signal and the second control signal when the first control signal and the second control signal contain preset abnormalities. In accordance with this example embodiment, when the control signal outputted from the control unit contains abnormality, the supply of power to the upper electrode and the lower electrode may be stopped. By way of example, when the control unit cannot check amplitude changes of the first control signal and the second control signal within a certain period, the outputs of the first control signal and the second control signal from the control unit may be stopped.

In an example embodiment, the DC power supply may be configured to monitor the inputted second control signal, and the DC power supply may stop the output of the output voltage when the second control signal contains a preset abnormality. In accordance with this example embodiment, the DC power supply unit may stop the voltage application to the upper electrode when there is abnormality in the second control signal as an input signal. By way of example, the DC power supply may stop the output of the output voltage when the amplitude change of the second control signal inputted within a certain period is not checked.

In an example embodiment, the second control signal may be a pulse signal configured to switch the DC power supply unit connected with the upper electrode between the first DC power supply unit and the second DC power supply unit. The DC power supply may compare the output voltage from the DC power supply with the inputted second control signal, and the DC power supply may stop the output of the output voltage when there is a difference equal to or higher than a preset value between a frequency of the output voltage and a frequency of the second control signal or when there is a difference equal to or higher than a preset value between a duty ratio of the output voltage and a duty ratio of the second control signal. In accordance with this example embodiment, when the output voltage in response to the control signal from the control unit is not outputted, the DC power supply may stop the voltage application to the upper electrode.

In an example embodiment, the high frequency power supply may monitor the inputted first control signal, and the high frequency power supply may stop the output of the high frequency power when the first control signal contains a preset abnormality. In accordance with this example embodiment, when there is abnormality in the first control signal as an input signal, the high frequency power supply may stop the voltage application to the lower electrode. By way of example, the high frequency power supply may stop the output when the amplitude change of the first control signal inputted within a certain period is not checked.

In an example embodiment, the first control signal may be a pulse signal configured to switch between the output of the high frequency power and the stop of the output thereof. The high frequency power supply may compare the high frequency power from the high frequency power supply with the inputted first control signal, and the high frequency power supply may stop the output of the high frequency power when there is a difference equal to or higher than a preset value between a frequency of the high frequency power and a frequency of the first control signal or when there is a difference equal to or higher than a preset value between a duty ratio of the high frequency power and a duty ratio of the first control signal. In accordance with this example embodiment, when the high frequency power in response to the control signal from the control unit is not outputted, the high frequency power supply may stop the power application to the lower electrode.

In an example embodiment, the high frequency power supply may monitor the high frequency power from the high frequency power supply during a period set between a preset period from when the output of the high frequency power is started and a preset period from the timing before the output of the high frequency power is stopped and to the timing when the output of the high frequency power is stopped in the period where the high frequency power is outputted, and the high frequency power supply may control the output of the high frequency power based on the monitored high frequency power. In accordance with this example embodiment, during the period in which the reflection wave does not have an influence on the monitored value of the high frequency power, it is possible to monitor the high frequency power. Therefore, the high frequency power supply can be favorably controlled.

In accordance with another example embodiment, a parallel plate type plasma etching apparatus may include a processing chamber; a gas supply unit configured to supply a processing gas into the processing chamber; a mounting table, configured to mount a target substrate thereon, having a lower electrode; an upper electrode which is provided within the processing chamber to face the lower electrode; and a power supply system provided in any one of the example embodiments described above.

This parallel plate type plasma etching apparatus includes the above-described power supply system, and, thus, as a cycle of switching negative DC voltages different in absolute value and applied to the upper electrode is shortened, the output voltage of the DC power supply can be followed. As such, even if the cycle of switching from the first DC voltage to the second DC voltage is shortened, the output voltage of the DC power supply can be followed. Thus, more electrons can be efficiently irradiated to an organic mask on the target substrate. As a result, a further improvement in a modification effect on the organic mask can be achieved.

In accordance with yet another aspect, there is provided a plasma etching method using the above-described plasma etching apparatus. The plasma etching method includes alternately repeating an output of high frequency power for plasma generation to a lower electrode provided within a processing chamber and a stop of the output thereof at a preset frequency, and outputting a first negative DC voltage to an upper electrode provided to face the lower electrode within the processing chamber during a period where the high frequency power is outputted and a second negative DC voltage having a higher absolute value than that of the first DC voltage to the upper electrode during a period where the output of the high frequency power is stopped; and alternately repeating the output of the high frequency power for plasma generation to the lower electrode and the stop of the output at the preset frequency, and outputting one of the first DC voltage and the second DC voltage to the upper electrode both during the period where the high frequency power is outputted and during the period where the output of the high frequency power is stopped.

In accordance with this plasma etching method, electrons in an optimum amount, which depends on an etching status of the target substrate (for example, a difference in mask material), can be irradiated to the target substrate.

Effect of the Invention

As explained above, in accordance with the power supply system, the output voltage of the DC power supply can be followed by switching of negative DC voltages different in absolute value and applied to the upper electrode of the parallel plate type plasma etching apparatus at a high frequency.

BRIEF DESCRIPTION OF THE DRAWINGS

FIG. 18 is a diagram for explaining a relationship between a pulse frequency and selectivity in experimental examples 5 to 8.

MODE FOR CARRYING OUT THE INVENTION

Figure 1:
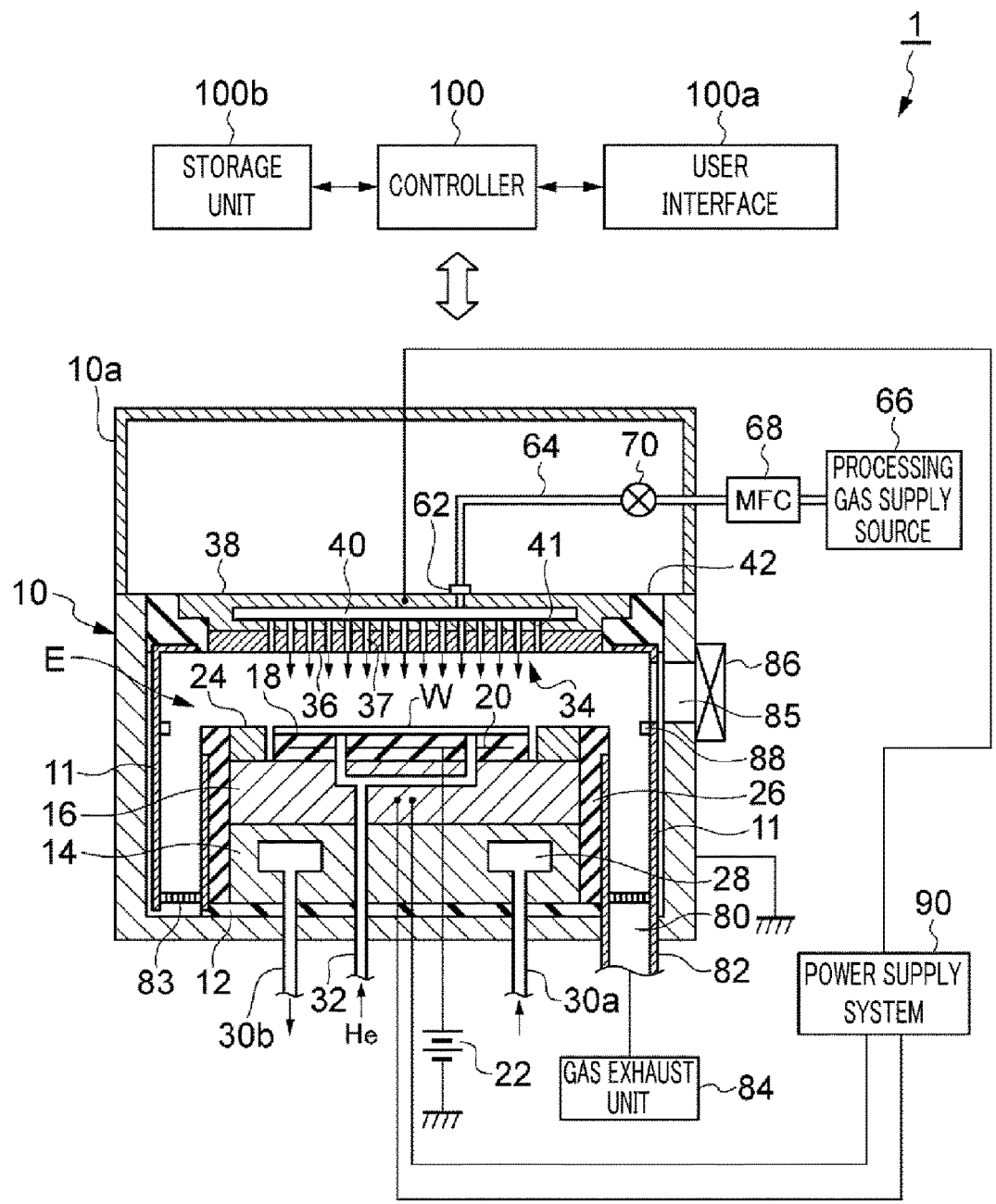
FIG. 1 is a cross-sectional view schematically showing a plasma etching apparatus in accordance with an example embodiment.

Hereinafter, various example embodiments will be explained with reference to the accompanying drawings. Further, in the drawings, similar symbols typically identify similar components, unless context dictates otherwise.

FIG. 1 is a cross-sectional view schematically showing a plasma etching apparatus including a power supply system in accordance with an example embodiment. A plasma etching apparatus 1 depicted in FIG. 1 is configured as a capacitively coupled parallel plate type plasma etching apparatus and includes a substantially cylindrical processing chamber 10. The processing chamber 10 is made of, e.g., aluminum with an anodically oxidized surface. The processing chamber 10 is frame-grounded.

On a bottom of the processing chamber 10, an insulating plate 12 made of ceramics is provided, and on the insulating plate 12, a cylindrical susceptor supporting table 14 is provided. On the susceptor supporting table 14, a susceptor 16 made of, e.g., aluminum is provided. In the example embodiment, the susceptor 16 serves as a lower electrode, and also serves as a mounting table on which a semiconductor wafer W as a target substrate is mounted. In the plasma etching apparatus 1, a cylindrical inner wall member 26 is provided along a side surface of the susceptor supporting table 14 and a side surface of the susceptor 16. The inner wall member 26 is made of, e.g., quartz.

On a top surface of the susceptor 16, an electrostatic chuck 18 for attracting and holding the semiconductor wafer W by an electrostatic force is provided. This electrostatic chuck 18 has an electrode 20 formed of a conductive film between a pair of insulating layers or insulating sheets, and the electrode 20 is electrically connected with a DC power supply 22. The semiconductor wafer W can be attracted and held on the electrostatic chuck 18 by the electrostatic force such as a Coulomb force generated by a DC voltage from the DC power supply 22.

On the top surface of the susceptor 16, a focus ring (correction ring) 24 is provided to surround the electrostatic chuck 18. The focus ring 24 is conductive and made of, e.g., silicon. The focus ring 24 can improve an etching uniformity.

Within the susceptor supporting table 14, a coolant path 28 is provided. A coolant, such as cooling water, of a predetermined temperature is supplied and circulated from a chiller unit, which is provided outside the plasma etching apparatus, into the coolant path 28 through lines 30a and 30b. By adjusting the temperature of the circulating coolant as such, a temperature of the semiconductor wafer W mounted on the susceptor 16 can be controlled.

Furthermore, in the plasma etching apparatus 1, a gas supply line 32 is provided. The gas supply line 32 is configured to supply a heat transfer gas, such as a He gas, between a top surface of the electrostatic chuck 18 and a rear surface of the semiconductor wafer W from a heat transfer gas supply unit.

Above the susceptor 16 serving as the lower electrode, an upper electrode 34 is provided to face the susceptor 16. The susceptor 16 and the upper electrode 34 are positioned approximately parallel with respect to each other. A space between the upper and lower electrodes 34 and 16 is a processing space E for performing a plasma etching process on the target substrate W. The upper electrode 34 is formed as a surface (facing surface) facing the semiconductor wafer W on the susceptor 16 serving as the lower electrode, and this facing surface is in contact with the processing space E as a plasma generation space.

The upper electrode 34 is supported at a top of the processing chamber 10 via an insulating shield member 42. The upper electrode 34 may include an electrode plate 36 and an electrode supporting body 38. The electrode plate 36 is formed as a surface facing the susceptor 16 and has multiple gas discharge holes 37. The electrode plate 36 may be made of a semiconductor or a conductor of a low resistance with low Joule's heat. As described below, the electrode plate 36 may be made of silicon or a silicon-containing material such as SiC in order to increase a resist.

The electrode supporting body 38 is configured to detachably support the electrode plate 36 and made of a conductive material such as aluminum. This electrode supporting body 38 may have a water-cooling structure. The electrode supporting body 38 includes therein a gas diffusion space 40. Multiple gas through holes 41 communicating with the gas discharge holes 37 are extended downwardly from the gas diffusion space 40. Further, on the electrode supporting body 38, there is provided a gas inlet opening 62 through which a processing gas is introduced into the gas diffusion space 40, and the gas inlet opening 62 is connected with a gas supply line 64.

The gas supply line 64 is connected with a processing gas supply unit 66. At the gas supply line 64, a mass flow controller (MFC) 68 and an opening/closing valve 70 are provided in sequence from an upstream side of the gas supply line 64. A FCS (Flow Control System) may be provided instead of the MFC. The processing gas supply unit 66 supplies a gas including a fluorocarbon-based gas ($C_xF_y$) as a processing gas for etching, such as $C_4F_8$ gas, or a gas including a corrosion gas, such as HBr, $Cl_2$, etc. The processing gas from the processing gas supply unit 66 is supplied into the gas diffusion space 40 through the gas supply line 64, and then, discharged into the processing space E via the gas through holes 41 and the gas discharge holes 37. That is, the upper electrode 34 functions as a shower head for supplying the processing gas.

The plasma etching apparatus 1 may further include a ground conductor 10a. The ground conductor 10a has a substantially cylindrical shape and extends upwardly from a sidewall of the processing chamber 10 to be higher than a height position of the upper electrode 34.

The plasma etching apparatus 1 includes a power supply system 90 in accordance with the example embodiment. The power supply system 90 is configured to apply a high frequency power to the lower electrode 16 and a DC voltage to the upper electrode 34. Details of the power supply system 90 will be provided below.

Further, in the plasma etching apparatus 1, a deposition shield 11 is detachably provided along an inner wall of the processing chamber 10. Furthermore, the deposition shield 11 is also provided at an outer periphery of the inner wall member 26. The deposition shield 11 suppresses an etching byproduct (deposit) from being attached to the processing chamber 10, and may be made of an aluminum material coated with ceramics such as $Y_2O_3$.

At a bottom portion of the processing chamber 10, there is provided an exhaust plate 83 between the inner wall member 26 and the inner wall of the processing chamber 10. The exhaust plate 83 may be made of an aluminum material coated with ceramics such as $Y_2O_3$. Under the exhaust plate 83 in the processing chamber 10, an exhaust opening 80 is formed. The exhaust opening 80 is connected with a gas exhaust unit 84 via an exhaust line 82. The gas exhaust unit 84 is configured to depressurize the inside of the processing chamber 10 to a preset vacuum level with a vacuum pump such as a turbo molecular pump. Further, at the sidewall of the processing chamber 10, a loading/unloading opening 85 for the semiconductor wafer W is provided. The loading/unloading opening 85 can be opened and closed by a gate valve 86.

Further, a conductive member (GND block) 88 is provided on the inner wall of the processing chamber 10. The conductive member 88 is positioned on the inner wall of the processing chamber 10 to be at the substantially same height position as that of the semiconductor wafer W in a longitudinal direction. The conductive member 88 is connected to the ground in DC manner, and has an effect of suppressing an abnormal electric discharge. Furthermore, the position of the conductive member 88 is not limited to the example shown in FIG. 1 as long as the conductive member 88 is positioned within the plasma generation space. By way of example, the conductive member 88 may be provided on the side of the susceptor 16, e.g., around the susceptor 16 and it may also be provided in the vicinity of the upper electrode 34, e.g., outside the upper electrode 34 in a ring shape.

Each component of the plasma etching apparatus 1, such as a power supply unit, a gas supply unit, a driving unit, or the power supply system 90, is configured to be connected with and controlled by a main controller 100 including a microprocessor (computer). The main controller 100 is also connected with a user interface 100a including a keyboard through which an operator inputs a command to manage the plasma etching apparatus 1 and a display on which an operation status of the plasma etching apparatus 1 is visually displayed.

Further, the main controller 100 is connected with a storage unit 100b configured to store therein: a control program by which the main controller 100 controls various kinds of processes performed in the plasma etching apparatus 1; and a program, i.e., a processing recipe, which allows each component of the plasma etching apparatus 1 to perform a process according to a processing condition. The processing recipe is stored in a storage medium in the storage unit 100b. The storage medium may be a hard disk or a semiconductor memory, or may be a portable medium such as a CD-ROM, a DVD, and a flash memory. Alternatively, the processing recipe may be appropriately transmitted from another apparatus through a dedicated line.

If necessary, a certain processing recipe is retrieved from the storage unit 100b and executed by the main controller 100 in response to an instruction from the user interface 100a. Thus, a required process is performed in the plasma etching apparatus 1 under the control of the main controller 100.

Figure 2:
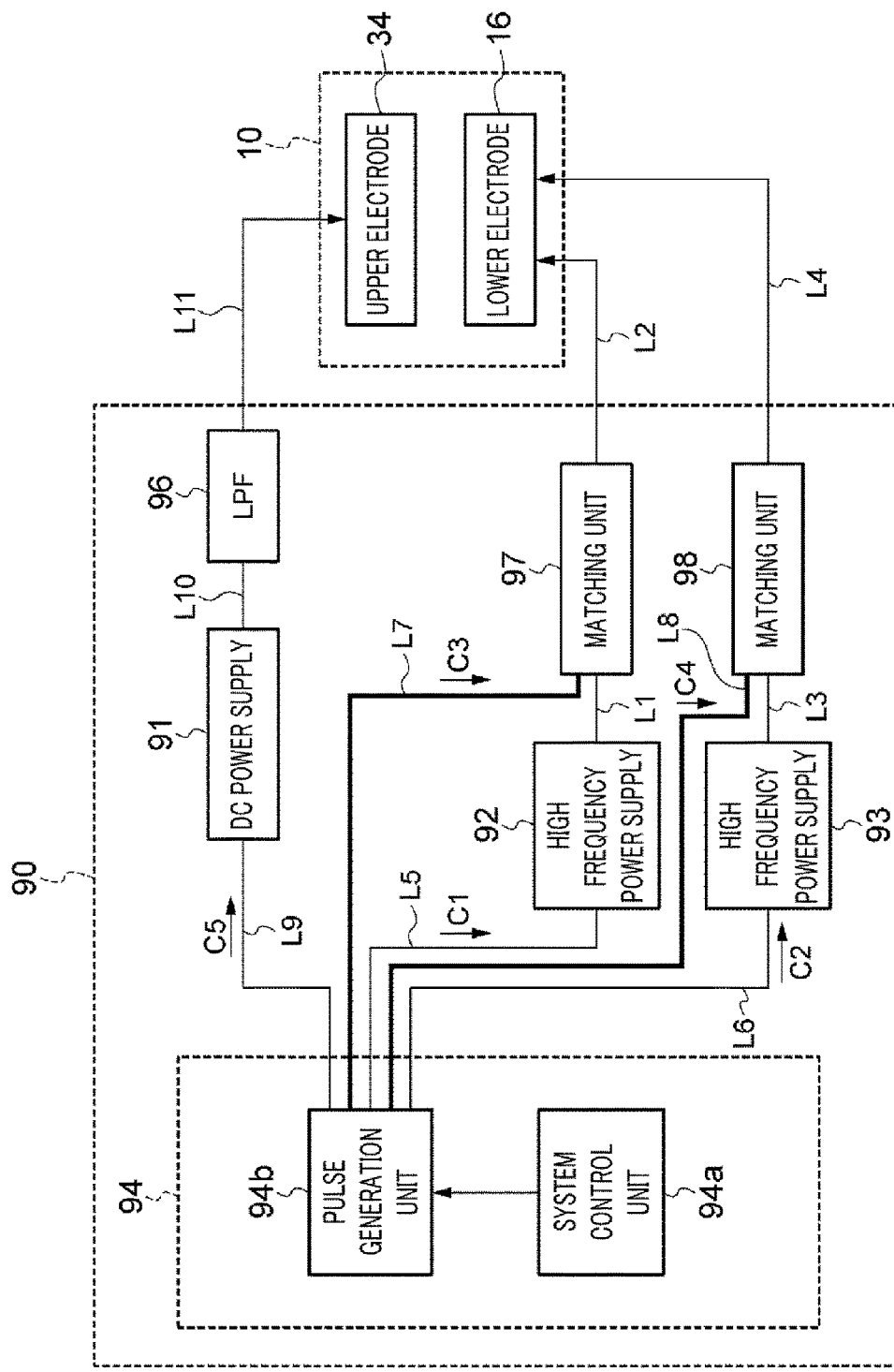
FIG. 2 is a diagram schematically showing a configuration of a power supply system in accordance the example embodiment.

Hereinafter, the power supply system 90 will be explained in detail with reference to FIG. 2. FIG. 2 is a diagram showing a configuration of a power supply system in accordance the example embodiment. As depicted in FIG. 2, the power supply system 90 includes a DC power supply 91, high frequency power supplies 92 and 93, and a control unit 94. Further, the power supply system 90 includes a low pass filter (LPF) 96 and matching units 97 and 98.

The first high frequency power supply 92 is configured to generate a first high frequency power for plasma generation and output the first high frequency power to the first matching unit 97 via a line L1. The first high frequency power supply 92 outputs the first high frequency power in the range of from about 27 MHz to about 100 MHz, for example, 40 MHz. The first high frequency power supply 92 is connected to the lower electrode 16 via the first matching unit 97. The first matching unit 97 is configured to match load impedance with internal (or output) impedance of the first high frequency power supply 92. When plasma is generated within the processing chamber 10, the first matching unit 97 matches the load impedance with the output impedance of the first high frequency power supply 92, and outputs the first high frequency power to the lower electrode 16 via a line L2.

The second high frequency power supply 93 is configured to apply a bias to the semiconductor wafer W, and generate a second high frequency power for ion attraction to the semiconductor wafer W, and also configure to output the second high frequency power to the second matching unit 98 via a line L3. The second high frequency power supply 93 outputs the second high frequency power in the range of from about 400 kHz to about 13.56 MHz, for example, 3 MHz. The second high frequency power supply 93 is connected with the lower electrode 16 via the second matching unit 98. The second matching unit 98 is configured to match load impedance with an internal (or output) impedance of the second high frequency power supply 93. When plasma is generated within the processing chamber 10, the second matching unit 98 matches the load impedance with the output impedance of the second high frequency power supply 93, and outputs the second high frequency power to the lower electrode 16 via a line L4.

The high frequency power supplies 92 and 93 and the matching units 97 and 98 are connected with the control unit 94 and controlled by the control unit 94. The control unit 94 includes a system control unit 94a and a pulse generation unit 94b. The system control unit 94a is connected with the pulse generation unit 94b. The system control unit 94a is configured to output a signal for allowing the pulse generation unit 94b to generate a pulse signal based on a control signal inputted from the main controller 100.

The pulse generation unit 94b is connected with the first high frequency power supply 92, the second high frequency power supply 93, the first matching unit 97, and the second matching unit 98. The pulse generation unit 94b outputs several (multiple) pulse signals having a certain frequency and a duty ratio based on the signal inputted from the system control unit 94a. Herein, the pulse signal alternately has a first level and a second level in the amplitude thereof. Hereinafter, although the first level will be described as being higher than the second level, the second level may be higher than the first level.

The control unit 94 is configured to control an on/off operation of the first high frequency power supply 92. Therefore, the control unit 94 applies one of pulse signals outputted from the pulse generation unit 94b as a control signal C1 to the first high frequency power supply 92 via a line L5. This control signal C1 may be a first control signal in the example embodiment. The first high frequency power supply 92 outputs the first high frequency power and stops the output thereof according to a level of the control signal C1. By way of example, the first high frequency power supply 92 outputs the first high frequency power when the control signal C1 is at the first level, and stops the output of the first high frequency power when the control signal C1 is at the second level. Thus, the processing chamber 10 alternately has a state where plasma is generated and a state where the plasma is not generated.

Further, the control unit 94 controls an on/off operation of the second high frequency power supply 93. To be specific, the control unit 94 controls an on/off operation of the second high frequency power supply 93 such that during a period where the first high frequency power supply 92 outputs the first high frequency power, the second high frequency power is outputted by the second high frequency power supply 93, and during a period where the first high frequency power supply 92 stops the output of the first high frequency power, the output of the second high frequency power by the second high frequency power supply 93 is stopped. Therefore, the control unit 94 applies one of pulse signals outputted from the pulse generation unit 94b as a control signal C2 to the second high frequency power supply 93 via a line L6. The second high frequency power supply 93 outputs the second high frequency power and stops the output thereof according to a level of the control signal C2. By way of example, the second high frequency power supply 93 outputs the second high frequency power when the control signal C2 is at the first level, and stops the output of the second high frequency power when the control signal C2 is at the second level.

Further, the control signal C1 applied to the first high frequency power supply 92 and the control signal C2 applied to the second high frequency power supply 93 may be synchronized with each other. That is, a phase of the control signal C1 may be equal to a phase of the control signal C2. Furthermore, the same pulse signal may be used as the control signal C1 and the control signal C2. Otherwise, there may be a certain phase difference between the control signal C1 and the control signal C2. That is, a certain phase difference may be set between the control signal C1 and the control signal C2 such that during a part of the period where the first high frequency power supply 92 outputs the first high frequency power, the second high frequency power can be outputted by the second high frequency power supply 93, and during a part of the period where the first high frequency power supply 92 stops the output of the first high frequency power, the output of the second high frequency power by the second high frequency power supply 93 can be stopped.

Further, the control unit 94 controls the first matching unit 97 to synchronize a matching operation of the first matching unit 97 with the on/off operation of the first high frequency power supply 92. Therefore, the control unit 94 applies one of pulse signals outputted from the pulse generation unit 94b as a control signal C3 to the first matching unit 97 via a line L7. Furthermore, the control unit 94 controls the second matching unit 98 to synchronize a matching operation of the second matching unit 98 with the on/off operation of the second high frequency power supply 93. Therefore, the control unit 94 applies one of pulse signals outputted from the pulse generation unit 94b as a control signal C4 to the second matching unit 98 via a line L8.

If the first matching unit 97 cannot follow the on/off operation of the first high frequency power supply 92, the control unit 94 may control the first matching unit 97 not to be operated. That is, the control unit 94 may control the first matching unit 97 such that a matching state when the first high frequency power supply 92 is turned on can be maintained even when the first high frequency power supply 92 is turned off. Further, if the second matching unit 98 cannot follow the on/off operation of the second high frequency power supply 93, the control unit 94 may control the second matching unit 98 not to be operated. That is, the control unit 94 may control the second matching unit 98 such that a matching state when the second high frequency power supply 93 is turned on can be maintained even when the second high frequency power supply 93 is turned off. However, if the operations of the first matching unit 97 and the second matching unit 98 are carried out quickly enough, the first matching unit 97 may be controlled such that the internal impedance of the first high frequency power supply 92 becomes equal to the load impedance including plasma within the processing chamber 10. Likewise, the second matching unit 98 may be controlled such that the internal impedance of the second high frequency power supply 93 becomes equal to the load impedance including plasma within the processing chamber 10.

Figure 3:
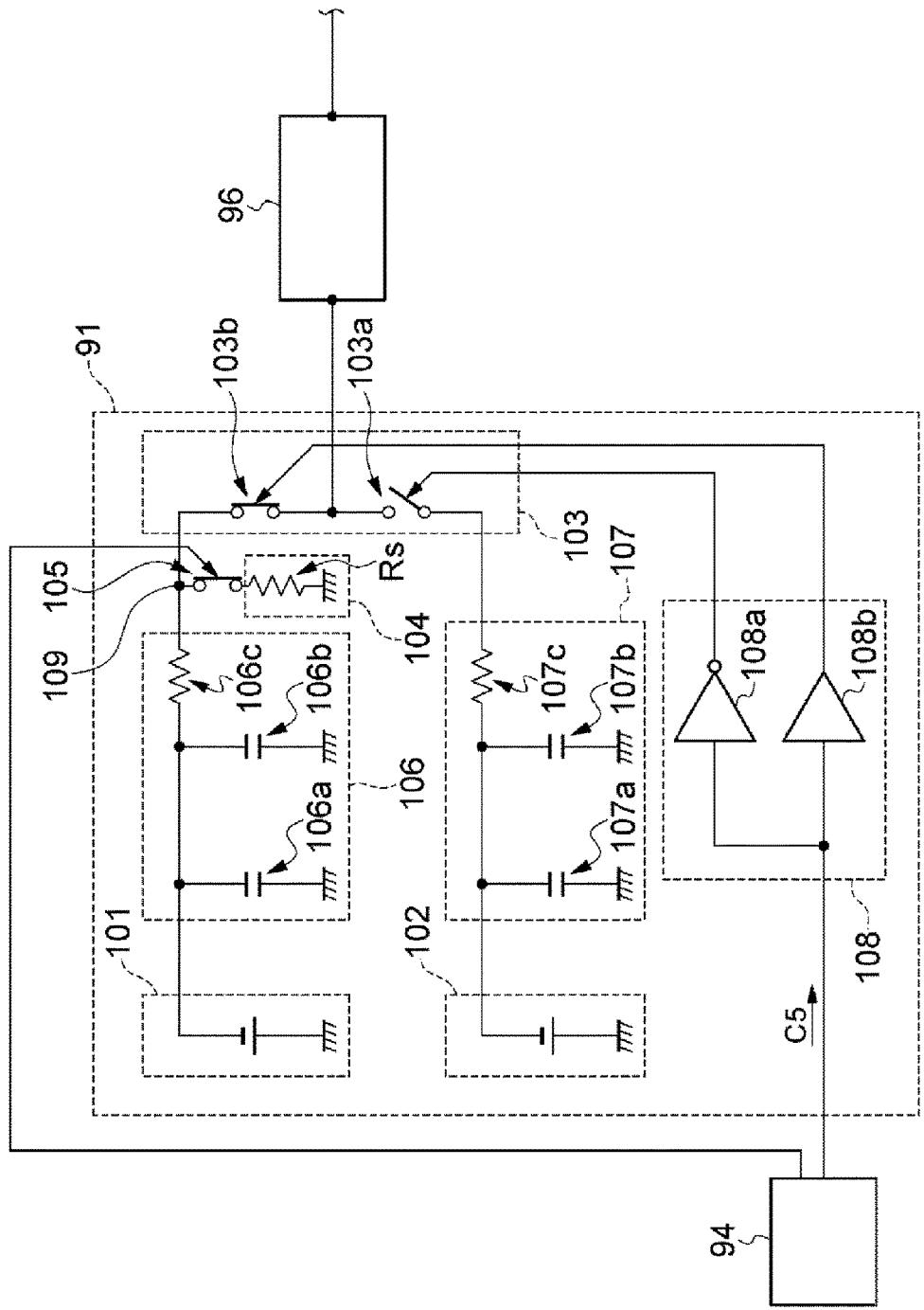
FIG. 3 is a circuit diagram showing a configuration of a DC power supply in accordance the example embodiment.

As depicted in FIG. 2, the DC power supply 91 applies an output voltage, which is a negative DC voltage, to the upper electrode 34. The DC power supply 91 is connected with the control unit 94 via a line L9 and also connected with a LPF 96 via a line L10. Further, the LPF 96 is connected with the upper electrode 34 via a line L11. Hereinafter, the DC power supply 91 will be further explained with reference to FIG. 2 and FIG. 3. FIG. 3 is a circuit diagram showing a configuration of a DC power supply in accordance the example embodiment. The DC power supply 91 depicted in FIG. 3 includes a first DC power supply unit 101, a second DC power supply unit 102, a selecting circuit 103, and a discharging circuit 104.

The first DC power supply unit 101 is electrically connected with the selecting circuit 103 and generates a first DC voltage, which is a negative DC voltage. The first DC voltage is set in the range of from about 0 V to about −800 V. In the example embodiment, between the first DC power supply unit 101 the selecting circuit 103, a circuit unit 106 configured to stabilize a value of the first DC voltage is provided. This circuit unit 106 includes capacitors 106a and 106b and a resistance element 106c. An one end of the resistance element 106c is connected with the first DC power supply unit 101, and the other end of the resistance element 106c is connected with the selecting circuit 103. Further, one ends of the capacitors 106a and 106b are connected with a ground potential, and the other ends thereof are connected with nodes between the first DC power supply unit 101 and the resistance element 106c. The capacitors 106a and 106b have a capacity of, for example, about 1 μF, and the resistance element 106c has a resistance value of, for example, 50 Ω.

The second DC power supply unit 102 is electrically connected with the selecting circuit 103 and generates a second DC voltage. The second DC voltage is a negative DC voltage and has an absolute value higher than an absolute value of the first DC voltage. In view of modifying (reforming) a mask made of, for example, an organic material, the absolute value of the second DC voltage is desirably set to be higher, and does not have an upper limit. However, considering a resistance of the plasma etching apparatus 1, the second DC voltage may be set to have an absolute value lower than 2000 V. Between the second DC power supply unit 102 and the selecting circuit 103, a circuit unit 107 configured to stabilize a value of the second DC voltage is provided. This circuit unit 107 includes capacitors 107a and 107b and a resistance element 107c. An one end of the resistance element 107c is connected with the second DC power supply unit 102, and the other end of the resistance element 107c is connected with the selecting circuit 103. Further, one ends of the capacitors 107a and 107b are connected with a ground potential, and the other ends thereof are connected with nodes between the second DC power supply unit 102 and the resistance element 107c. The capacitors 107a and 107b have a capacity of, for example, about 1 μF, and the resistance element 107c has a resistance value of, for example, 50 Ω.

The selecting circuit 103 is configured to selectively connect the first DC power supply unit 101 and the second DC power supply unit 102 to the upper electrode 34. In the example embodiment, the selecting circuit 103 includes two switching units 103a and 103b. Each of the switching units 103a and 103b includes a first terminal, a second terminal, and a control terminal. A first terminal of the switching unit 103b is electrically connected with the first DC power supply unit 101. A first terminal of the switching unit 103a is electrically connected with the second DC power supply unit 102. A second terminal of the switching unit 103a and a second terminal of the switching unit 103b are electrically connected with each other, and a node between these output terminals is connected with the upper electrode 34 via the LPF 96. Further, the LPF 96 traps high frequency powers from the first high frequency power supply 92 and the second high frequency power supply 93, and may include, for example, an LR filter or an LC filter.

The control terminal of the switching unit 103a and the control terminal of the switching unit 103b are connected to the pulse generation unit 94b of the control unit 94 via the circuit unit 108. The circuit unit 108 includes an inverting circuit 108a connected with the switching unit 103a and a non-inverting circuit 108b connected with the switching unit 103b. One of pulse signals outputted from the pulse generation unit 94b of the control unit 94 is supplied as a control signal C5 to the DC power supply 91. The control signal C5 may be a second control signal in the example embodiment. This control signal C5 controls the switching unit 103a and the switching unit 103b such that the first DC power supply unit 101 can be selectively connected with the upper electrode 34 during a period where the first high frequency power supply 92 outputs the first high frequency power, and the second DC power supply unit 102 can be selectively connected with the upper electrode 34 during a period where the first high frequency power supply 92 stops the output of the first high frequency power. By way of example, when the control signal C5 has the first level, the switching unit 103b is closed and the first DC power supply unit 101 is connected with the upper electrode 34, and when the control signal C5 has the second level, the switching unit 103a is closed and the second DC power supply unit 102 is connected with the upper electrode 34. If the control signal C5 is supplied to the DC power supply 91, an inverting pulse signal of the control signal C5 is supplied from the inverting circuit 108a to the control terminal of the switching unit 103a. To the control terminal of the switching unit 103b, a non-inverting signal of the control signal C5 is supplied from the non-inverting circuit 108b. Thus, the selecting circuit 103 selectively connects the first DC power supply unit 101 to the upper electrode 34 during the period where the first high frequency power supply 92 outputs the first high frequency power. Further, the selecting circuit 103 selectively connects the second DC power supply unit 102 to the upper electrode 34 during the period where the first high frequency power supply 92 stops the output of the first high frequency power.

Further, the control signal C5 may be synchronized with the control signal C1 and the control signal C2. Furthermore, a pulse signal same as the control signal C1 and/or the control signal C2 may be used as the control signal C5. Otherwise, there may be a certain phase difference between the control signal C5 and the control signal C1. That is, a certain phase difference may be set between the control signal C1 and the control signal C5 such that during a part of the period where the first high frequency power supply 92 outputs the first high frequency power, the first DC power supply unit 101 can be selectively connected with the upper electrode 34, and during a part of the period where the first high frequency power supply 92 stops the output of the first high frequency power, the second DC power supply unit 102 can be selectively connected with the upper electrode 34.

Further, as depicted in FIG. 3, the DC power supply 91 may further include the discharging circuit 104. The discharging circuit 104 is connected with a node 109 between the first DC power supply unit 101 and the selecting circuit 103. To be specific, this node 109 is provided between the input terminal of the switch terminal 103b and the circuit unit 106. The discharging circuit 104 is configured to discharge electric charges accumulated in the processing chamber 10 to the ground potential when the DC power supply unit connected with the upper electrode 34 is switched from the second DC power supply unit 102 to the first DC power supply unit 101. In the example embodiment, the discharging circuit 104 includes a resistance element Rs. One end of the resistance element Rs is connected with an ground potential, and the other end thereof is connected with the node 109. The resistance element Rs has a resistance value of, for example, from about 50 to about 100 kΩ, and may have a resistance value of, for example, 200 Ω.

As such, in the plasma etching apparatus 1, when the DC power supply unit connected with the upper electrode 34 is switched from the second DC power supply unit 102 to the first DC power supply unit 101, electrons accumulated in the processing chamber 10 are rapidly discharged through the discharging circuit 104. Thus, when the DC power supply unit connected with the upper electrode 34 is switched from the second DC power supply unit 102 to the first DC power supply unit 101, an output voltage of the DC power supply 91 is rapidly controlled to the first DC voltage. Therefore, the output voltage of the DC power supply 91 can be followed by the switching of negative DC voltages different in absolute value and applied to the upper electrode 34 at a high frequency. By way of example, the DC power supply 91 can be followed by the switching of DC voltages at a frequency of higher than 20 kHz. As such, an output voltage of the DC power supply can be followed by the switching of DC voltage values at a high frequency, and, thus, more electrons can be efficiently irradiated to an organic mask on the semiconductor wafer W. As a result, a further improvement in a modification effect on the organic mask can be achieved.

As depicted in FIG. 3, in the example embodiment, the DC power supply 91 of the plasma etching apparatus 1 may further include a switch circuit 105. This switch circuit 105 is provided between the discharging circuit 104 and the node 109. The switch circuit 105 may selectively connect the discharging circuit 104 to the node 109. To be specific, if the first DC power supply unit 101 and the second DC power supply unit 102 are alternately connected with the upper electrode 34, the switch circuit 105 is closed, so that the discharging circuit 104 can be connected with the node 109. On the other hand, if only one of the first DC power supply unit 101 and the second DC power supply unit 102 is continuously connected with the upper electrode 34, the switch circuit 105 is opened, so that the discharging circuit 104 is disconnected from the node 109. Such control of the switch circuit 105 can be carried out in response to a control signal from the control unit 94. As such, the plasma etching apparatus 1 can switch a mode between a first mode where the first DC power supply unit 101 and the second DC power supply unit 102 are alternately connected with the upper electrode 34 and a second mode where only one of the first DC power supply unit 101 and the second DC power supply unit 102 is continuously connected with the upper electrode 34.

Figure 4:
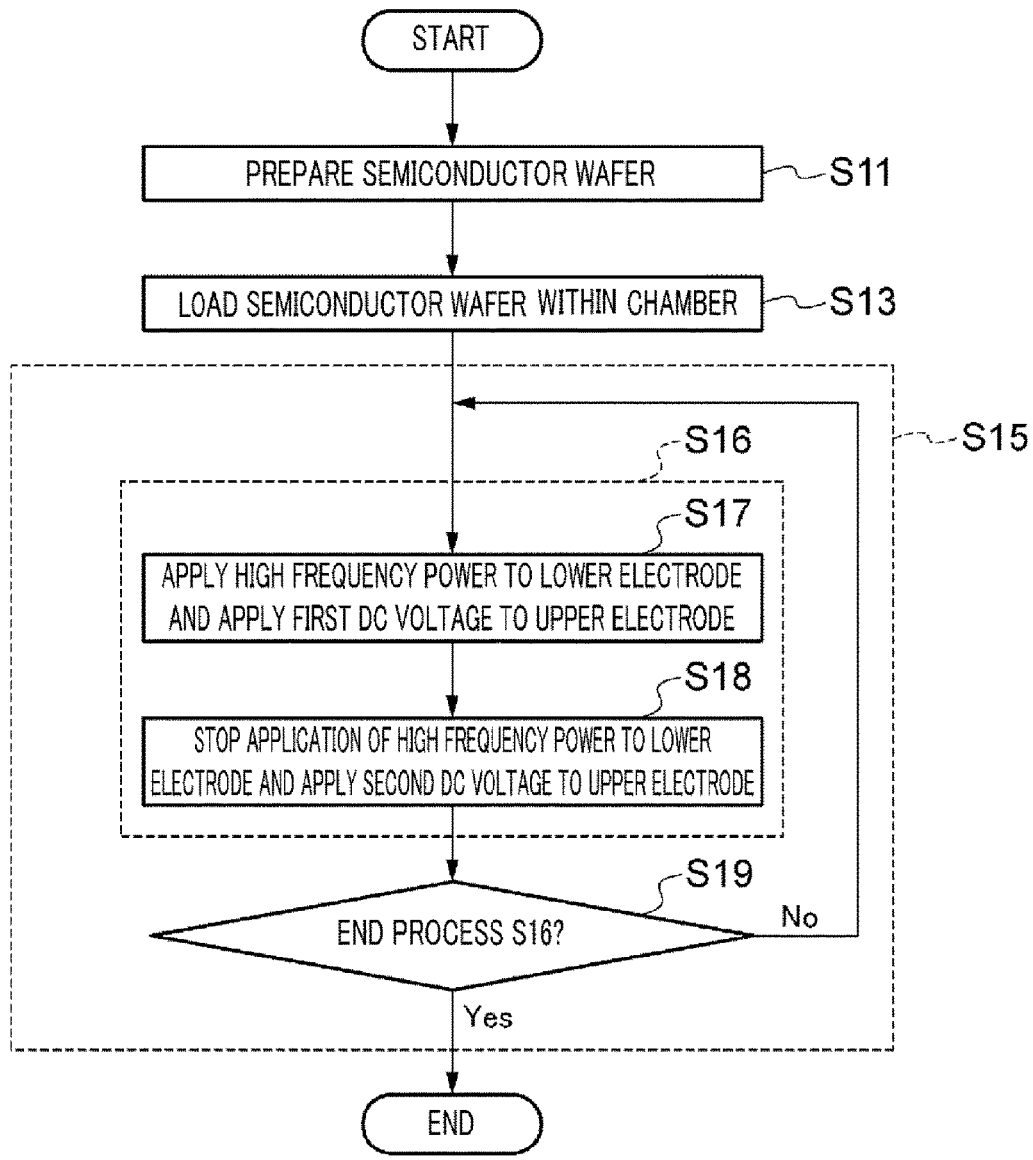
FIG. 4 is a flowchart showing a main process of a plasma etching method in accordance the example embodiment.

Hereinafter, an example embodiment of a plasma etching method using the plasma etching apparatus 1 depicted in FIG. 1 will be explained. FIG. 4 is a flowchart showing a main process of a plasma etching method in accordance the example embodiment.

(First Process: S11)

Figure 8:
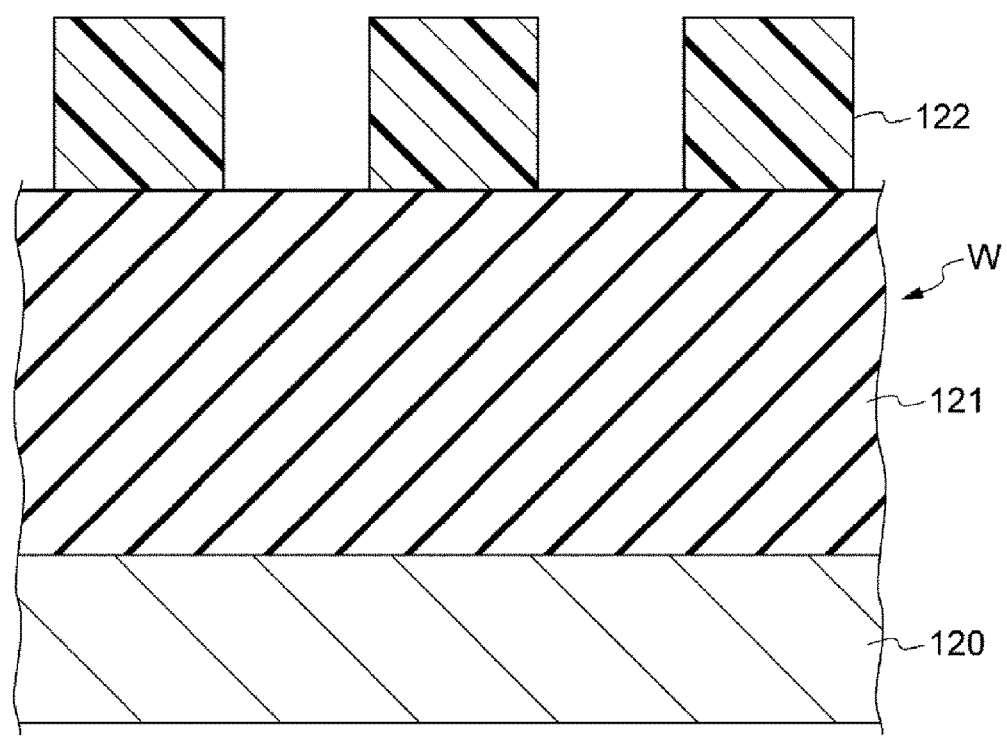
FIG. 8 is a cross-sectional view schematically illustrating a target substrate.

In a plasma etching method as shown in FIG. 4, a semiconductor wafer W serving as a target substrate is first prepared. As depicted in FIG. 8, for example, the prepared semiconductor wafer W may have a structure in which an insulating film 121 is formed on a Si substrate 120, and a photoresist film (for example, an ArF resist film) 122 patterned by the photolithography is formed thereon as an etching mask.

(Second Process: S13)

Then, in the present method, the semiconductor wafer W is loaded within the plasma etching apparatus 1. To be specific, the gate valve 86 is opened, and the semiconductor wafer W configured as described above is loaded into the processing chamber 10 through the loading/unloading opening 85 to be mounted on the susceptor 16. Then, the gate valve 86 is closed, and a processing gas is supplied from the processing gas supply unit 66 into the processing chamber 10 at a certain flow rate while the inside of the processing chamber 10 is decompressed by the gas exhaust unit 84. A pressure within the processing chamber 10 is set to a value in the range of, for example, from about 0.1 Pa to about 150 Pa. Herein, the semiconductor wafer W is supported at the electrostatic chuck 18 by applying a DC voltage to the electrode 20 of the electrostatic chuck 18 from the DC power supply 22.

Herein, as the processing gas, a halogen-containing gas represented by a fluorocarbon-based gas ($C_xF_y$), such as $C_4F_8$ gas, may be used. Further, the processing gas may contain other gas such as an Ar gas or an $O_2$ gas in addition thereto.

(Third Process: S15)

Figure 5:
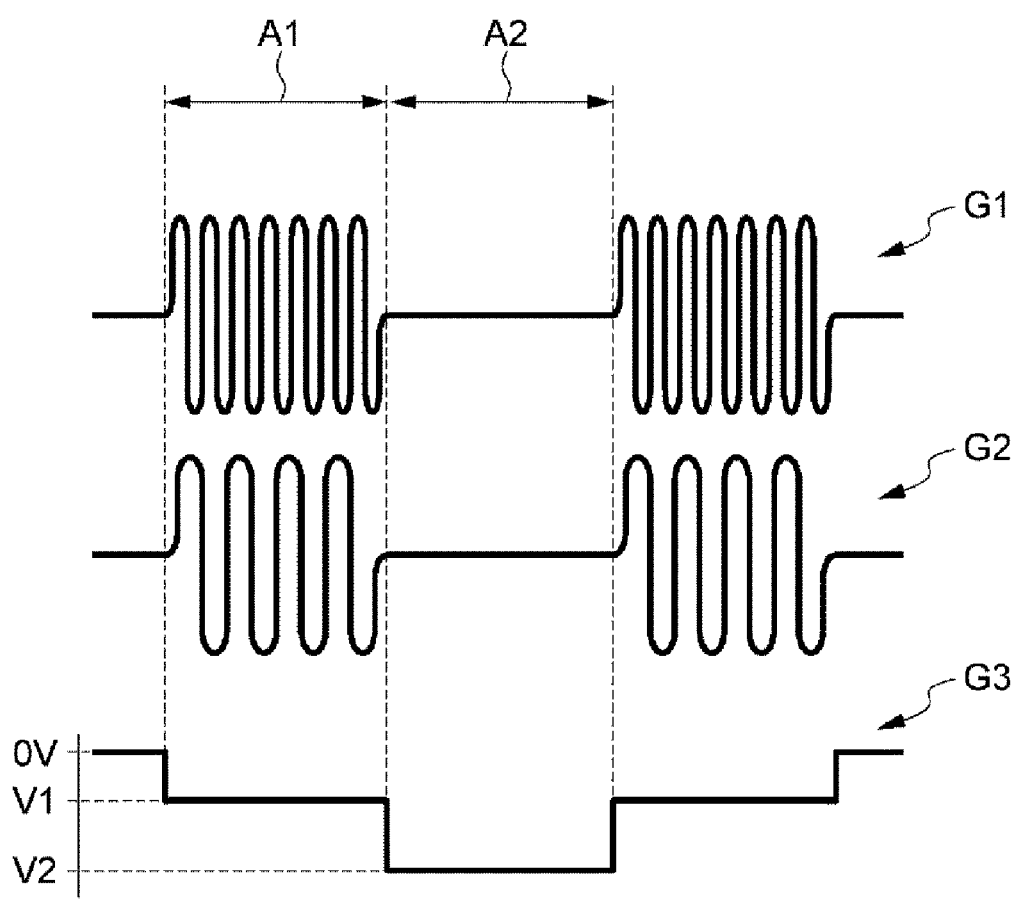
FIG. 5 is a timing chart showing examples of output waveforms of high frequency power supplies and a waveform of an output voltage of a DC power supply.

In a subsequent third process of the present method, a process S17 and a process S18 are alternately and repeatedly performed. During a period A1 where the process S17 is carried out, the first high frequency power supply 92 applies the first high frequency power (see a waveform G1 in FIG. 5) to the lower electrode 16 in response to the control signal C1 at the first level, and the second high frequency power supply 93 applies the second high frequency power (see a waveform G2 in FIG. 5) to the lower electrode 16 in response to the control signal C2 at the first level. Further, during the period A1, the DC power supply 91 applies a first DC voltage V1 (see a waveform G3 in FIG. 5) to the upper electrode 34 in response to the control signal C5 at the first level. Thus, a high frequency electric field is formed between the upper electrode 34 and the lower electrode 16, and a processing gas supplied into the processing space E is excited into plasma by the glow discharge generated by the electric field. By radicals or positive ions generated from the plasma, the insulating film 121 of the semiconductor wafer W is etched with the photoresist film 122 as a mask. Further, the first DC voltage applied to the upper electrode 34 during the period A1 is generated by the first DC power supply unit 101, and it has a negative voltage value and may be set depending on plasma to be generated.

During a period A2 where the process S18 is carried out, the first high frequency power supply 92 stops the output of the first high frequency power (see the waveform G1 in FIG. 5) in response to the control signal C1 at the second level, and the second high frequency power supply 93 stops the output of the second high frequency power (see the waveform G2 in FIG. 5) in response to the control signal C2 at the second level. Further, during the period A2, the DC power supply 91 applies a second DC voltage V2 (see the waveform G3 in FIG. 5) to the upper electrode 34 in response to the control signal C5 at the second level. Thus, during the period A2, secondary electrons generated when the positive ions in the processing space E collide with the upper electrode 34 are accelerated toward the semiconductor wafer W and irradiated to the semiconductor wafer W. Further, the period A2 may have a time of about 50 µsec or less. Since the period A2 is set to about 50 µsec or less, it is possible to increase efficiency of an etching process by reducing a time period that does not contribute to the etching process.

In the third process S15, a process S16 including the process S17 and the process S18 is repeatedly performed until it is determined that an end condition is satisfied (process S19). An end condition of the process S16 can be determined by, for example, a time assumed to be enough to obtain a desired etching depth. If the end condition of the process S16 is satisfied, the present plasma etching method is finished.

In accordance with the above-described plasma etching method using the plasma etching apparatus 1, by applying the first high frequency power for plasma generation to the lower electrode 16, plasma can be generated in a region closer to the semiconductor wafer W. Further, the plasma is not diffused widely, and dissociation of the processing gas can be suppressed. As a result, even when a pressure within the processing chamber 10 is high and a plasma density is low, an etching rate can be increased. Furthermore, even when a frequency of the first high frequency power for plasma generation is high, relatively high ion energy can be obtained, so that the efficiency can be increased. Moreover, as described in the present example embodiment, the first high frequency power for plasma generation and the second high frequency power for ion attraction are independently applied to the lower electrode 16. Accordingly, it is possible to independently control a function of generating plasma and a function of attracting ions required for the plasma etching process. Therefore, it is possible to satisfy the conditions of the etching process requiring high fine processability. Further, since the high frequency power having a high frequency range of about 27 MHz or more is supplied as the first high frequency power for plasma generation, plasma can have a high density. Thus, even under a lower pressure, the high-density plasma can be generated.

In accordance with the present plasma etching method, a negative DC voltage is applied from the DC power supply 91 to the upper electrode 34. Thus, positive ions in the plasma collide with the upper electrode 34, and secondary ions are generated around the upper electrode 34. Then, the secondary ions are accelerated downward in a vertical direction, and the accelerated secondary ions (high-velocity electrons) can be irradiated to the semiconductor wafer W. Herein, the electrons irradiated to the semiconductor wafer W can modify and reinforce, for example, the photoresist film (especially, the ArF photoresist film) 122, which is an organic film having a low etching resistance.

Figure 6:
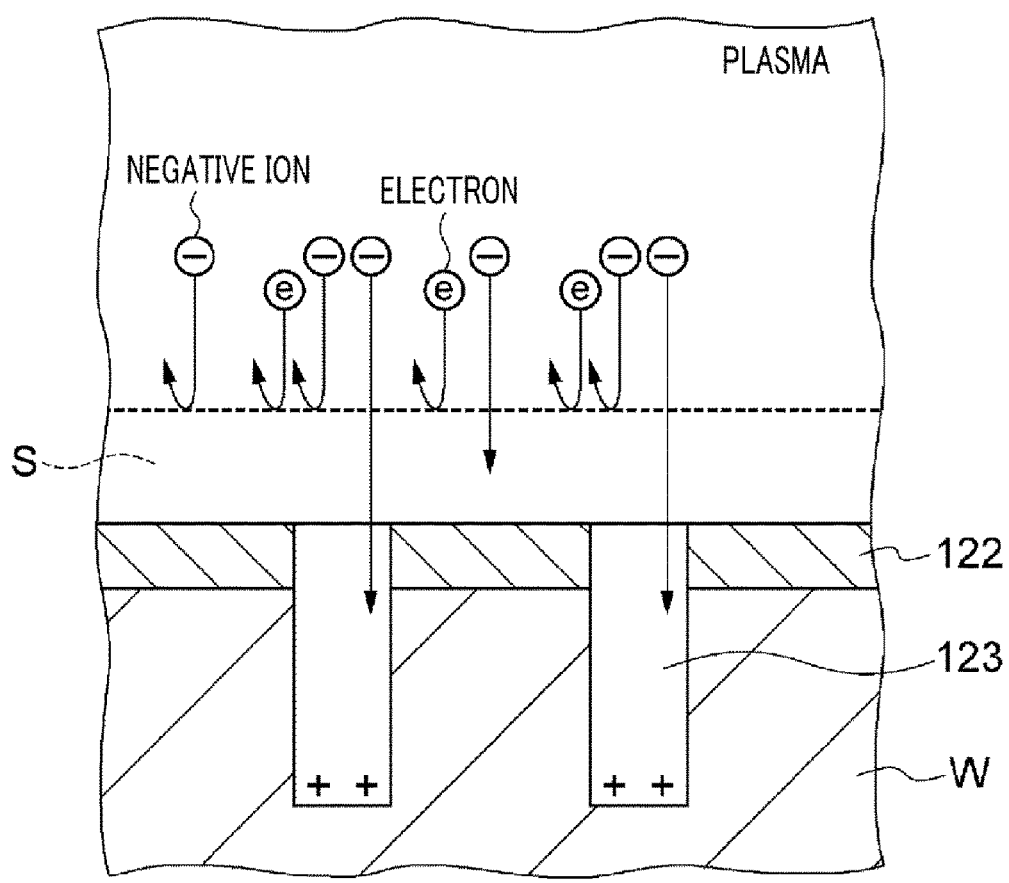
FIG. 6 is a diagram for explaining a relationship between a plasma sheath and secondary electrons.

However, such an organic mask modification effect by the high-velocity electrons depends on a thickness of a plasma sheath on the semiconductor wafer W. That is, during the etching process in the period A1, not only the high frequency power from the first high frequency power supply 92 but also the high frequency power for bias application from the second high frequency power supply 93 is applied. Thus, if a thickness of a plasma sheath S is increased as illustrated in FIG. 6, negative ions or electrons, which are not sufficiently accelerated by the DC voltage applied to the upper electrode 34, are bounded away due to the sheath S and cannot be supplied to the semiconductor wafer W. That is, the thick sheath S serves as a barrier, and, thus, the negative ions cannot be sufficiently supplied to a bottom of a contact hole 123 and an effect of neutralizing positive ions within the contact hole 123 cannot be achieved. Further, since the electrons cannot be sufficiently supplied to the photoresist film 122, a sufficient modification effect cannot also be achieved.

Figure 7:
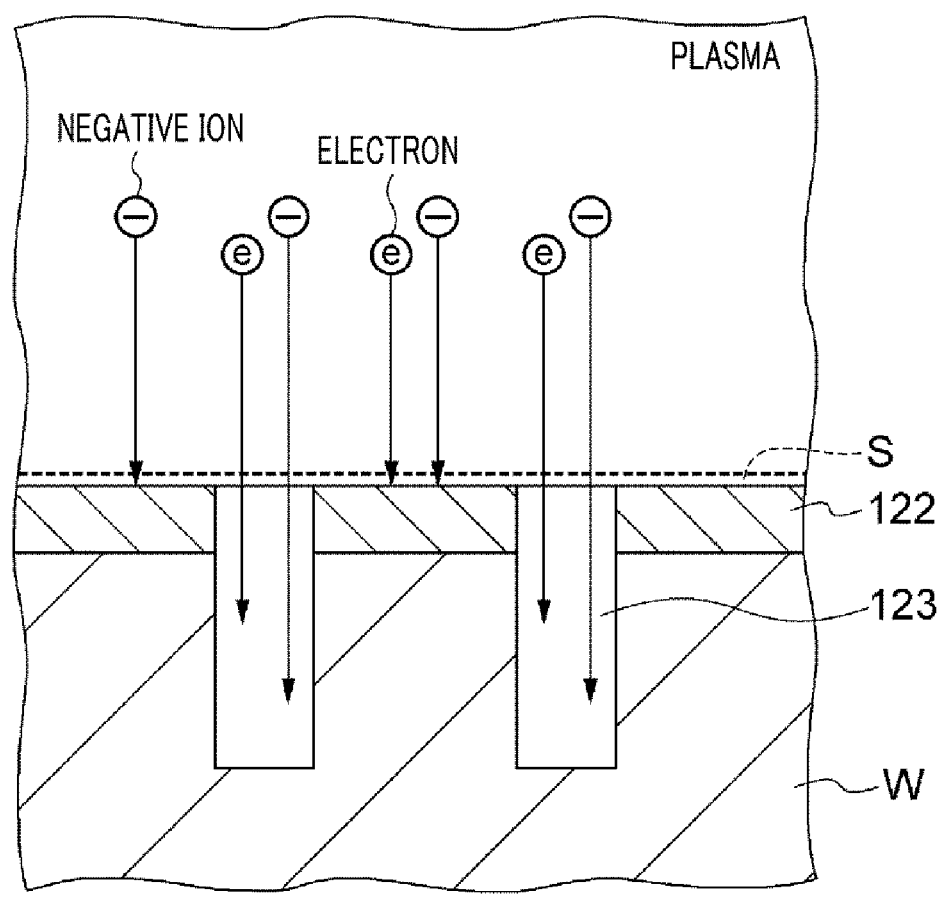
FIG. 7 is a diagram for explaining a relationship between a plasma sheath and secondary electrons.

However, as depicted in FIG. 7, during the period A2, the first high frequency power supply 92 and the second high frequency power supply 93 are turned off, and, thus, the plasma sheath S disappears or decreases. Therefore, the secondary electrons (high-velocity electrons) can be easily irradiated to the semiconductor wafer W. Further, during the period A2, the second negative DC voltage having a relatively high absolute value is applied to the upper electrode 34, and, thus, a large amount of electrons or negative ions can be supplied to the semiconductor wafer W.

Further, in the present plasma etching method, the plasma etching apparatus 1 is used. This apparatus 1 includes the DC power supply 91 of which an output voltage can be followed by the switching of negative DC voltages different in the absolute values and applied to the upper electrode 34 at a high frequency. As a result, it is possible to repeatedly perform the process S17 and the process S18 having a single cycle of the period A1 and the period A2 at a high frequency. Therefore, in the present plasma etching method, during a plasma-off period, a large amount of negative ions can be supplied to the bottom of the contact hole 123 and the effect of neutralizing positive ions within the contact hole 123 can be achieved. Further, a large amount of electrons can be irradiated to the photoresist film 122. As a result, a desirable etching profile can be obtained, and the modification effect on the photoresist film 122 can be further improved.

Figure 9:
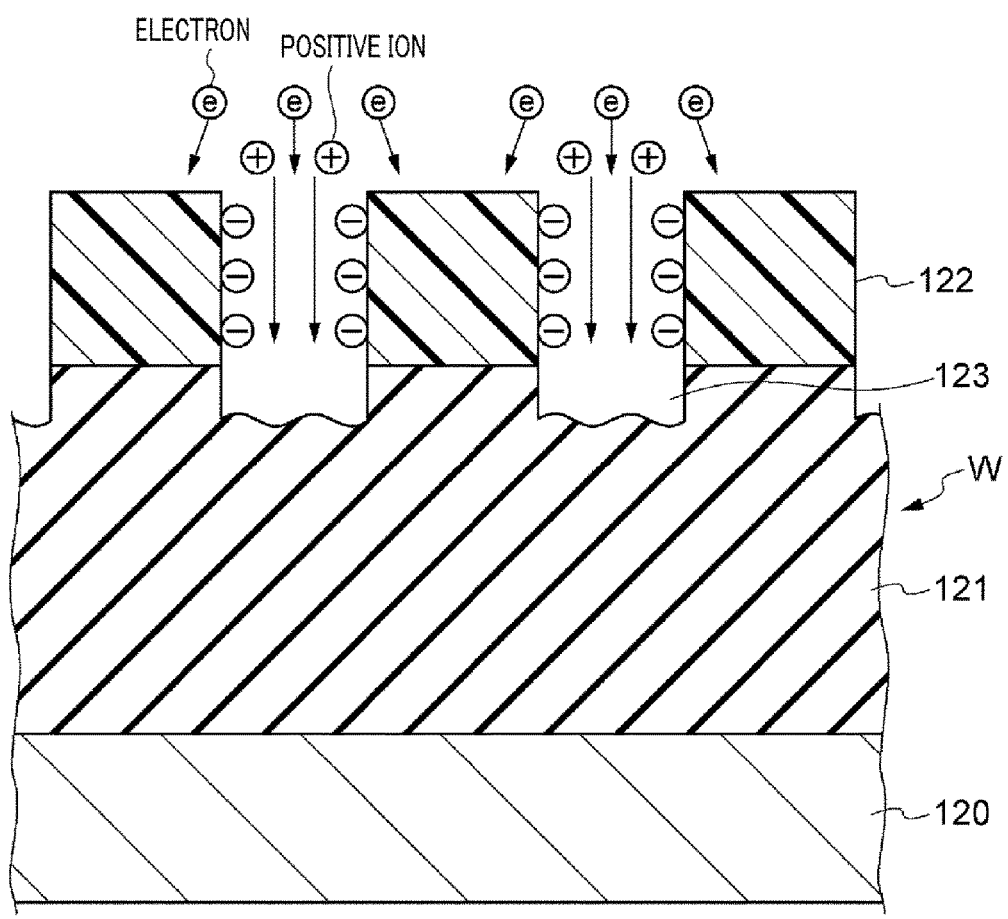
FIG. 9 is a cross-sectional view illustrating a status of a target substrate in an initial stage of the etching process.

However, in the conventional plasma etching method, as depicted in FIG. 9, in an initial stage of the etching process, the contact hole 123 formed by the etching process is shallow and the photoresist film 122 is negatively charged by electrons in plasma, and positive ions mainly carrying out the etching process can move straight toward the bottom of the contact hole 123 as indicated by an arrow. Further, in FIG. 9 and FIG. 10 to FIG. 12 to be referred to later, an electron is denoted by "e", a negative charge or a negative ion is denoted by "−", and a positive ion is denoted by "+".

Figure 10:
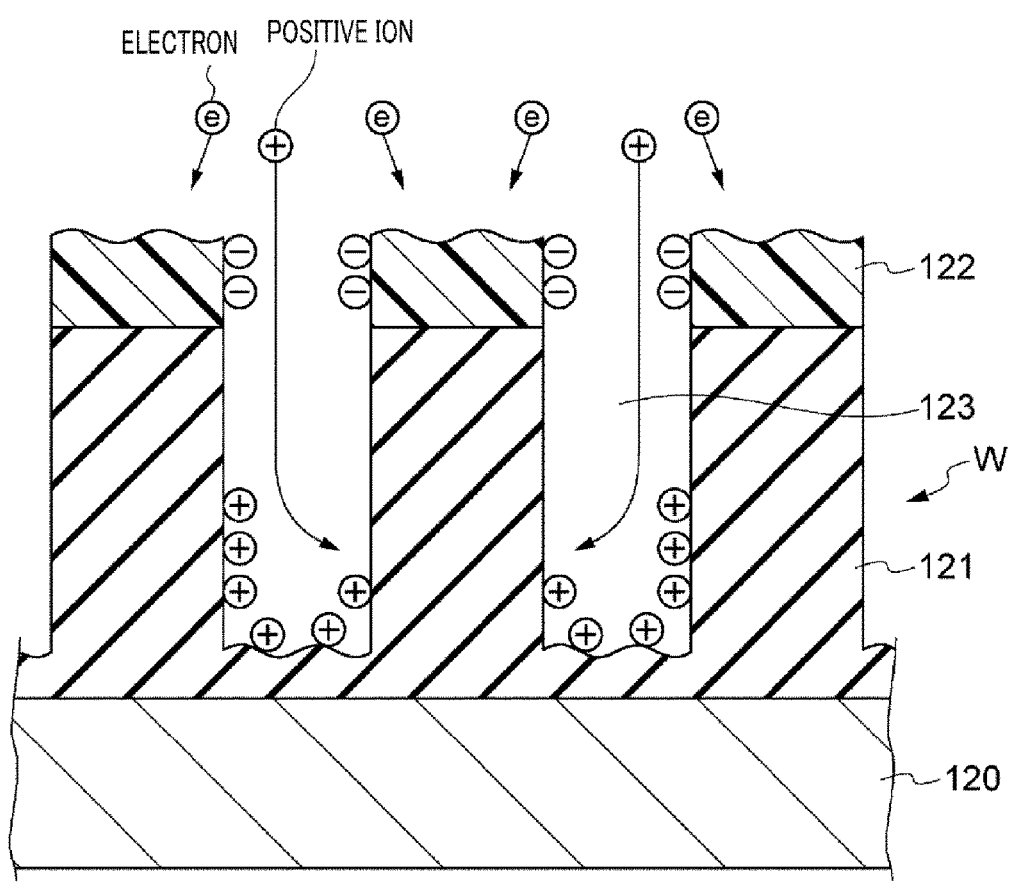
FIG. 10 is a cross-sectional view illustrating a status of the target substrate in an advanced stage of the etching process.

Further, in the conventional plasma etching method, the etching process is carried out from a state as depicted in FIG. 9, and when an aspect ratio of the contact hole 123 is increased as depicted in FIG. 10, a wall surface of the contact hole 123 becomes positively charged. Thus, the positive ions entering the contact hole 123 for the etching are repelled with positive charges within the contact hole 123, and a moving direction of the positive ion is bent as indicated by an arrow in the drawing. As a result, an etching profile is curved or deformed.

Figure 11:
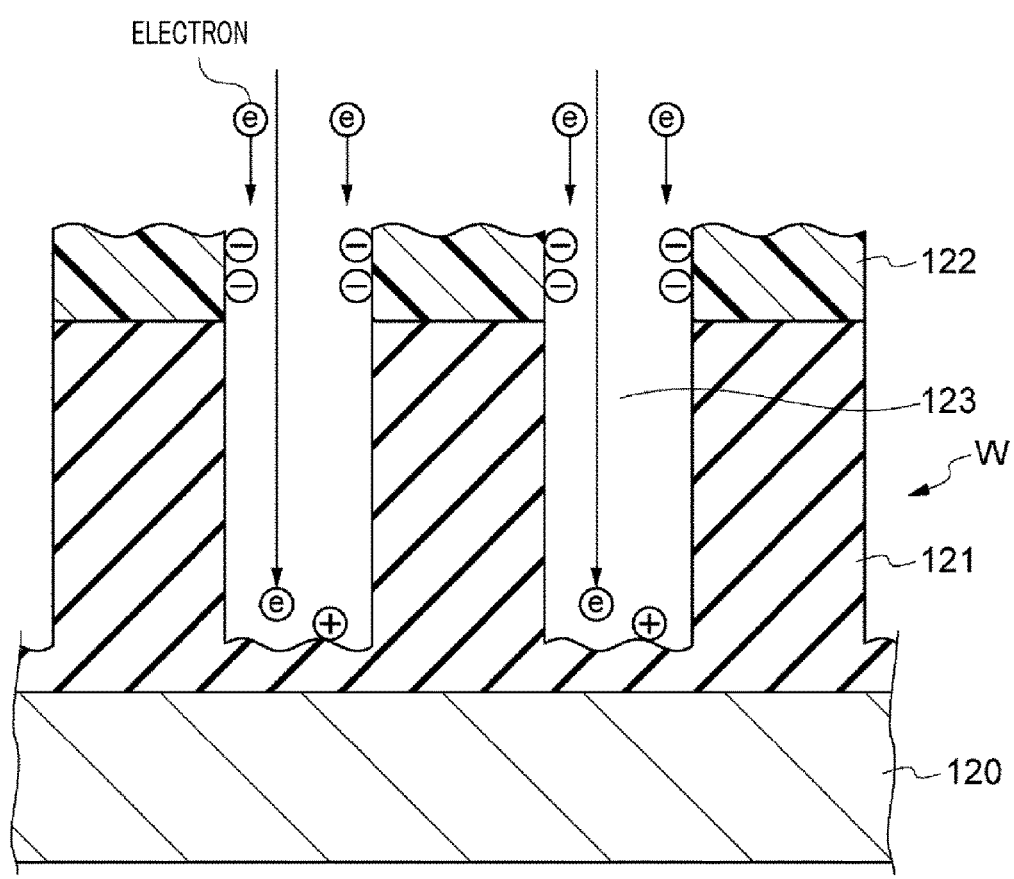
FIG. 11 is a cross-sectional view showing a status of the target substrate when application of the high frequency power for plasma generation is stopped.
Figure 12:
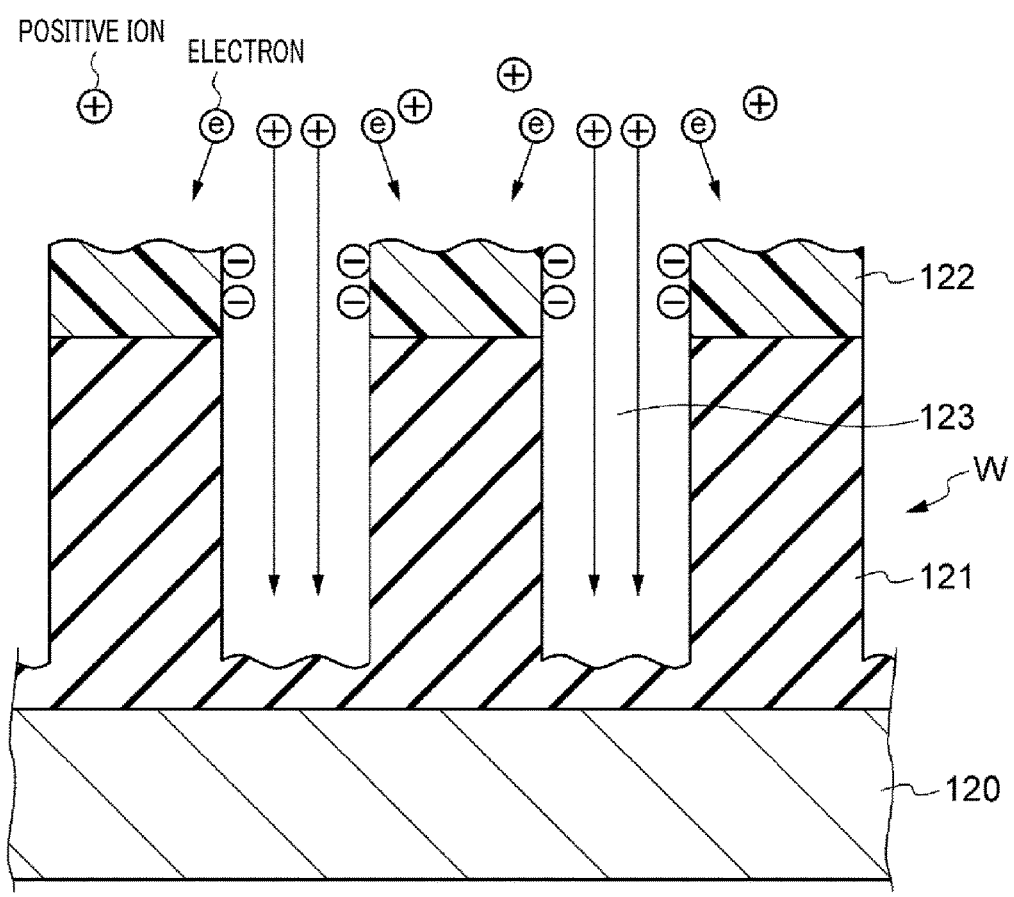
FIG. 12 is a cross-sectional view showing a status of a processing gas after the application of the high frequency power for plasma generation is stopped and then the high frequency power is applied again.

On the other hand, in the plasma etching method using the plasma etching apparatus 1, during the period A2 where the process S18 is carried out, as depicted in FIG. 11, electrons are supplied into the contact hole 123 and positive ions within the contact hole 123 are neutralized by the electrons. Therefore, as depicted in FIG. 12, when the first high frequency power supply 92 and the second high frequency power supply 93 are turned on during the subsequent period A1, the amount of the positive ions within the contact hole 123 has been decreased, so that the positive ions can move straight within the contact hole 123 as indicated by an arrow in the drawing. Therefore, in accordance with the present plasma etching method, an etching profile can be improved and an etching rate can also be increased.

Hereinafter, referring to FIG. 13, another example embodiment of a plasma etching method using the plasma etching apparatus 1 will be explained. In the plasma etching method depicted in FIG. 13, the first process S16 including the process S17 and the process S18 as shown in FIG. 4 is repeatedly performed, and a second process S23 is also repeatedly performed. In the first process S16, the first DC power supply unit 101 and the second DC power supply unit 102 are alternately connected with the upper electrode 34. That is, in the first process S16, the plasma etching apparatus 1 is used in the above-described first mode. In the second process S23, the plasma etching apparatus 1 is used in the above-described second mode.

Figure 13:
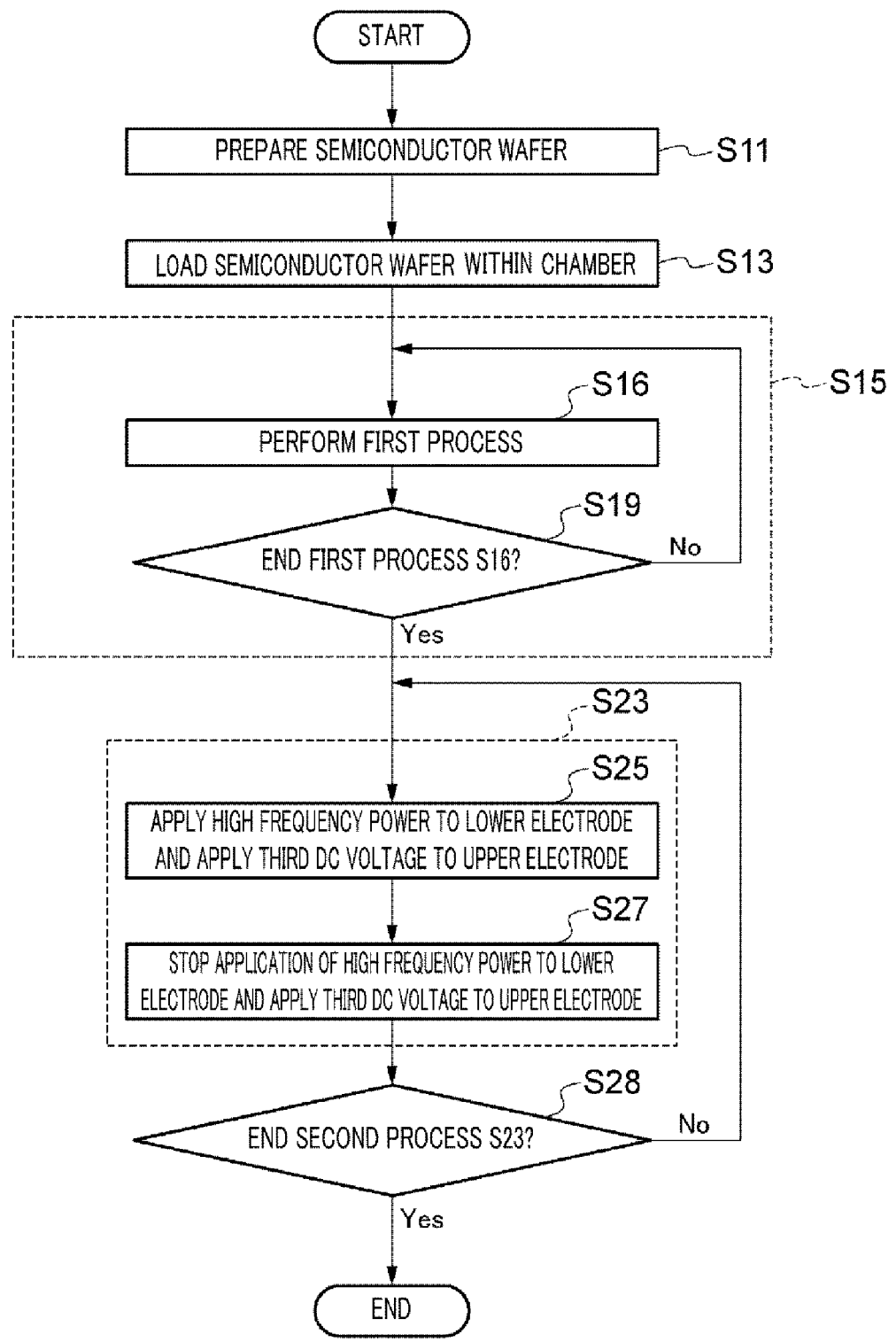
FIG. 13 is a flowchart showing a main process of a plasma etching method in accordance with another example embodiment.

As depicted in FIG. 13, the second process S23 includes a process S25 and a process S27 which are alternately carried out. During a period A6 where the process S25 is carried out, the first high frequency power supply 92 applies the first high frequency power (see a waveform G6 in FIG. 14) to the lower electrode 16 in response to the control signal C1 at the first level, and the second high frequency power supply 93 applies the second high frequency power (see a waveform G7 in FIG. 14) to the lower electrode 16 in response to the control signal C2 at the first level.

Further, during a period A7 where the process S27 is carried out, the first high frequency power supply 92 stops the output of the first high frequency power (see the waveform G6 in FIG. 14) in response to the control signal C1 at the second level, and the second high frequency power supply 93 stops the output of the second high frequency power (see the waveform G7 in FIG. 14) in response to the control signal C2 at the second level.

Figure 14:
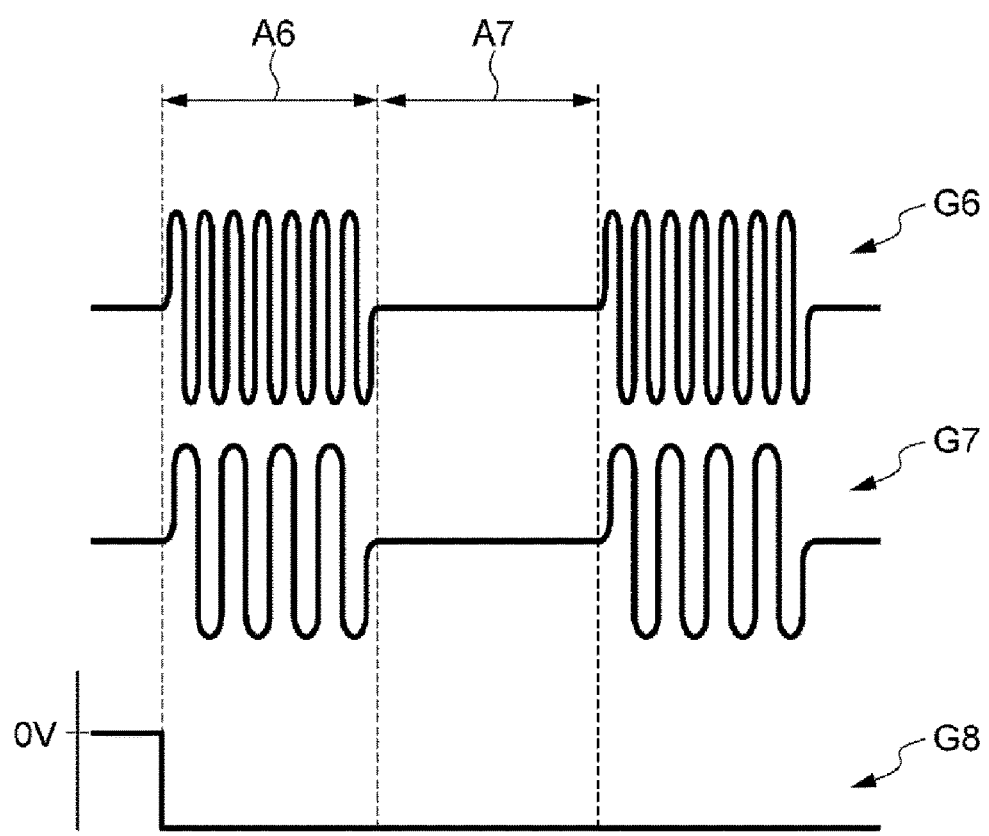
FIG. 14 is a timing chart showing examples of an output waveform of high frequency power supplies and a waveform of an output voltage of a DC power supply.

Furthermore, in the second process S23, during the periods A6 and A7, the DC power supply 91 continuously applies a third DC voltage to the upper electrode 34 (see a waveform G8 in FIG. 14). This third DC voltage is one of the above-described first DC voltage and second DC voltage. Therefore, in the DC power supply 91, only one of the switching units 103a and 103b is closed during the periods A6 and A7, so that only one of the first DC power supply unit 101 and the second DC power supply unit 102 is connected with the upper electrode 34. Moreover, in the second process S23, since the output voltage is not switched, the switch circuit 105 is opened and the discharging circuit 104 is disconnected from the node 109. Therefore, power consumption by the discharging circuit 104 is suppressed.

In the plasma etching method as depicted in FIG. 13, the second process S23 is repeated until it is determined that an end condition is satisfied (process S28). An end condition of the process S23 can be determined by, for example, a time assumed to be enough to obtain a desired etching depth. If the end condition of the process S23 is satisfied, the present plasma etching method is finished.

The plasma etching method as depicted in FIG. 13 can be used, for example, as described below. That is, if a large amount of electrons need to be supplied to the semiconductor wafer W, the first process S16 may be carried out, and if an amount of electrons to be supplied to the semiconductor wafer W is allowed to be reduced, the first DC power supply unit 101 may be connected with the upper electrode 34 to perform the second process S23. Further, an amount of electrons to be supplied to the semiconductor wafer W may depend on a film property of an etching target. As such, in accordance with the plasma etching method depicted in FIG. 13, an amount of electrons to be supplied to the semiconductor wafer W during the etching process can be controlled. Furthermore, the first process S16 and the second process S23 may be carried out in a sequence reverse to the sequence as shown in FIG. 13, or the first process S16 and the second process S23 may be alternately carried out.

Figure 15:
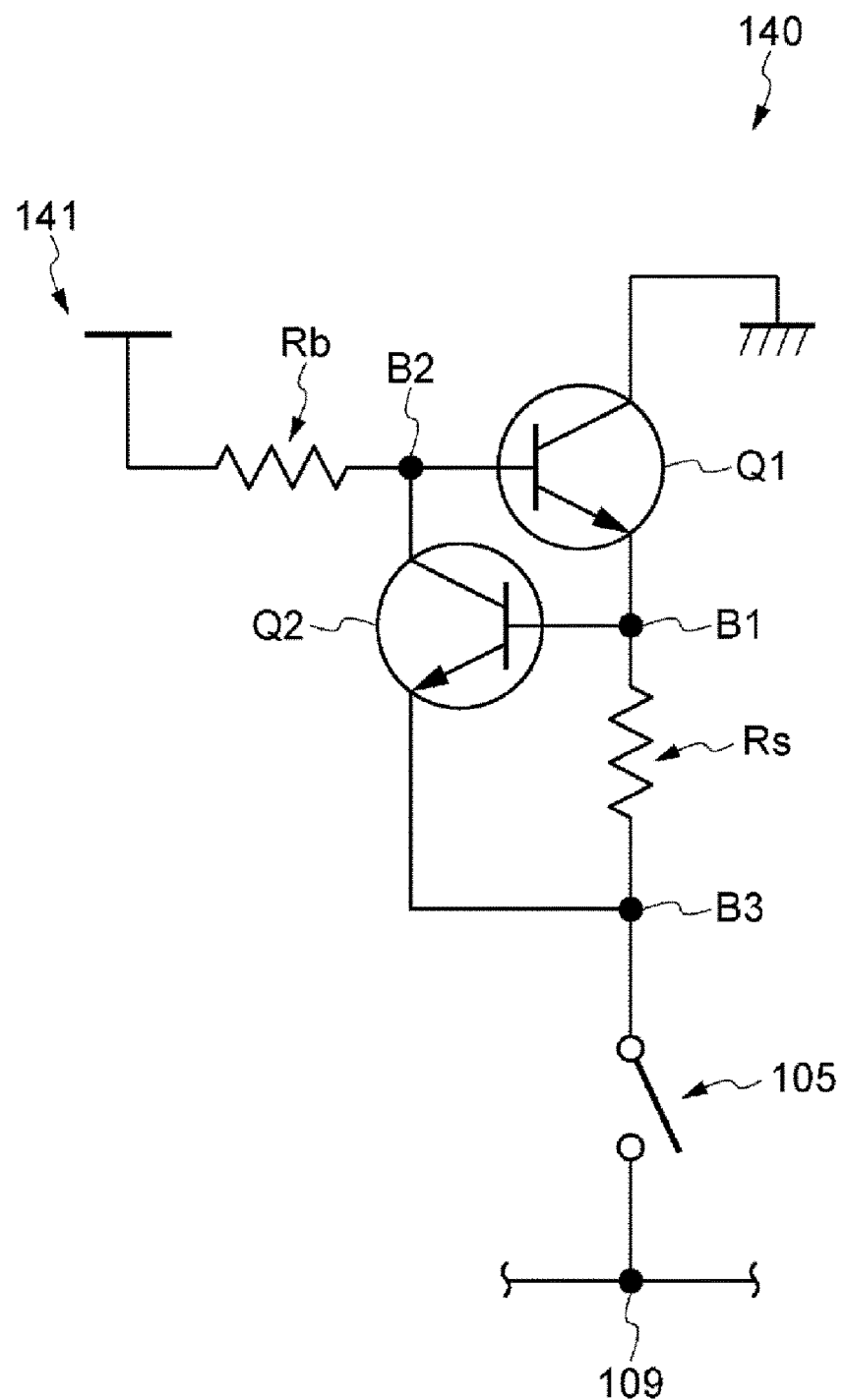
FIG. 15 is a circuit diagram illustrating a discharging circuit in accordance with another example embodiment.

Hereinafter, referring to FIG. 15, a discharging circuit of another example embodiment will be explained. In the plasma etching apparatus 1, a discharging circuit 140 as depicted in FIG. 15 may be used instead of the discharging circuit 104. This discharging circuit 140 is a current limiting circuit, and includes NPN transistors Q1 and Q2 and resistance elements Rb and Rs.

A collector of the transistor Q1 is connected with a ground potential, and an emitter thereof is connected with one end of the resistance element Rs and a base of the transistor Q2 via a node B1. The base of the transistor Q1 is connected with one end of the resistance element Rb and a collector of the transistor Q2 via a node B2. The collector of the transistor Q2 is connected with the one end of the resistance element Rb and the base of the transistor Q1 via the node B2, and the emitter thereof is connected with the other end of the resistance element Rs and the switch circuit 105 via a node B3. The one end of the resistance element Rb is connected with the base of the transistor Q1 and the collector of the transistor Q2 via the node B2, and the other end thereof is connected with a preset potential 141.

In this discharging circuit 140, a voltage that turns on the transistor Q1 is initially applied between the base and the emitter of the transistor Q1. Then, if the DC power supply unit connected with the upper electrode 34 is switched from the second DC power supply unit 102 to the first DC power supply unit 101, a current flowing through the resistance element Rs is increased, so that a voltage that turns on the transistor Q2 is generated between the base and the emitter of the transistor Q2. When the transistor Q2 is turned on, a current flows through the transistor Q2 and a base current of the transistor Q1 is decreased. Thus, the current flowing through the resistance element Rs is limited. Therefore, with the discharging circuit 140, it is possible to reduce an amount of power required for a DC power supply device.

Figure 16:
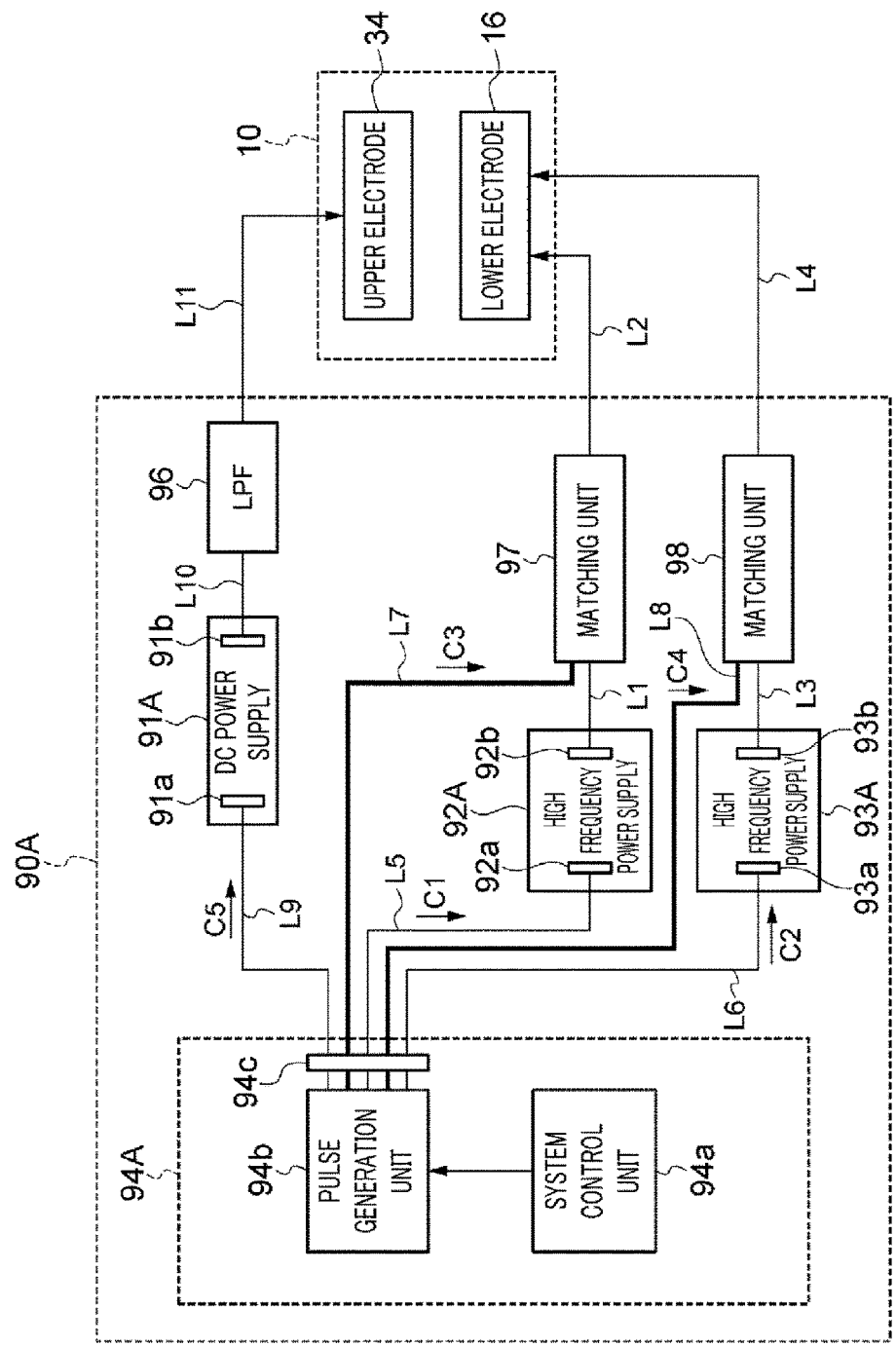
FIG. 16 illustrates a configuration of a power supply system in accordance with another example embodiment.

Hereinafter, referring to FIG. 16, a power supply system of another example embodiment will be explained. A power supply system 90A depicted in FIG. 16 is different from the power supply system 90 in that each of a DC power supply 91A, a first high frequency power supply 92A, a second high frequency power supply 93A, and a control unit 94A of the power supply system 90A has a function of monitoring a synchronization control status. Further, the other configurations and functions of these components of the power supply system 90A are the same as those of the corresponding components of the power supply system 90.

The DC power supply 91A further includes an input monitoring unit 91a configured to monitor the inputted control signal C5 and an output monitoring unit 91b configured to monitor an output voltage outputted from the DC power supply 91A. The input monitoring unit 91a is provided between the control unit 94A and the circuit unit 108 of the DC power supply 91A, and is configured to check whether there is an amplitude change of the control signal C5. Since the control signal C5 is a pulse signal, the amplitude thereof is changed at a single cycle in a normal state. On the other hand, in an abnormal state, the amplitude change of the control signal C5 is not observed over a single cycle or the amplitude thereof is not changed for a certain period of time or longer. When it is determined that the control signal C5 monitored by the input monitoring unit 91*a* is in the abnormal state, the DC power supply 91A is controlled to stop the output of the output voltage.

Further, the input monitoring unit 91*a* is configured to monitor a duty ratio and a frequency of the control signal C5. The output monitoring unit 91*b* is provided between the selecting circuit 103 and the LPF 96, and is configured to monitor a duty ratio and a frequency of the output voltage of the DC power supply 91A. The DC power supply 91A compares the frequency of the control signal C5 with the frequency of the output voltage of the DC power supply 91A. As a result of the comparison, if it is determined that there is a difference equal to or more than a preset critical value between these frequencies, the DC power supply 91A is controlled to stop the output of the output voltage. Further, the DC power supply 91A compares the duty ratio of the control signal C5 with the duty ratio of the output voltage of the DC power supply 91A. As a result of the comparison, if it is determined that there is a difference equal to or more than a preset critical value between these duty ratios, the DC power supply 91A is controlled to stop the output of the output voltage. Thus, if the output voltage in response to the control signal C5 from the control unit 94A is not outputted, the DC power supply 91A can stop the voltage application to the upper electrode 34.

The first high frequency power supply 92A further includes an input monitoring unit 92*a* configured to monitor the inputted control signal C1 and an output monitoring unit 92*b* configured to monitor the outputted first high frequency power. Further, the second high frequency power supply 93A further includes an input monitoring unit 93*a* configured to monitor the inputted control signal C2 and an output monitoring unit 93*b* configured to monitor the outputted first high frequency power.

The input monitoring unit 92*a* is configured to check whether there is an amplitude change of the control signal C1 inputted to the first high frequency power supply 92A. Since the control signal C1 is a pulse signal, the amplitude is changed at a single cycle in a normal state. On the other hand, in an abnormal state, the amplitude change of the control signal C1 is not observed over a single cycle or the amplitude of the control signal C1 is not changed for a certain period of time or longer. When it is determined that the control signal C1 monitored by the input monitoring unit 92*a* is in the abnormal state, the first high frequency power supply 92A is controlled to stop the output of the first high frequency power. Likewise, the input monitoring unit 93*a* is configured to check whether there is the amplitude change of the control signal C2 inputted to the second high frequency power supply 93A. When it is determined that the control signal C2 monitored by the input monitoring unit 93*a* is in an abnormal state, i.e., when a state where the amplitude change of the control signal C2 is not observed over a single cycle or the amplitude of the control signal C1 is not changed for a certain period of time or longer is detected, the second high frequency power supply 93A is controlled to stop the output of the second high frequency power.

The input monitoring unit 92*a* is configured to monitor a duty ratio and a frequency of the control signal C1 inputted to the first high frequency power supply 92A, and the input monitoring unit 93*a* is configured to monitor a duty ratio and a frequency of the control signal C2 inputted to the second high frequency power supply 93A. The output monitoring unit 92*b* is configured to monitor a duty ratio and a frequency of an output signal from the first high frequency power supply 92A, and the output monitoring unit 93*b* is configured to monitor a duty ratio and a frequency of an output signal from the second high frequency power supply 93A. The first high frequency power supply 92A compares the frequency of the monitored control signal C1 with the frequency of the output signal. As a result of the comparison, if it is determined that there is a difference equal to or more than a preset critical value between these frequencies, the first high frequency power supply 92A is controlled to stop the output of the first high frequency power. Likewise, the second high frequency power supply 93A compares the frequency of the monitored control signal C2 with the frequency of the output signal. As a result of the comparison, if it is determined that there is a difference equal to or more than a preset critical value between these frequencies, the second high frequency power supply 93A is controlled to stop the output of the second high frequency power. Further, the first high frequency power supply 92A compares the duty ratio of the monitored control signal C1 with the duty ratio of the output signal. As a result of the comparison, if it is determined that there is a difference equal to or more than a preset critical value between these duty ratios, the first high frequency power supply 92A is controlled to stop the output of the first high frequency power. Likewise, the second high frequency power supply 93A compares the duty ratio of the monitored control signal C2 with the duty ratio of the output signal. As a result of the comparison, if it is determined that there is a difference equal to or more than a preset critical value between these duty ratios, the second high frequency power supply 93A is controlled to stop the output of the second high frequency power. With this configuration, if the first high frequency power in response to the control signal C1 from the control unit 94A and the second high frequency power in response to the control signal C2 are not outputted, the first and second high frequency power supplies 92A and 93A can stop the power supplying to the lower electrode 16.

The control unit 94A further includes an output monitoring unit 94*c* configured to monitor the outputted control signal C1, control signal C2, and control signal C5. The output monitoring unit 94*c* is provided between the pulse generation unit 94*b* and the DC power supply 91A, the first and second high frequency power supplies 92A and 93A. Further, the output monitoring unit 94*c* is configured to check whether there is an amplitude change the control signals C1, C2, and C5. Since the control signals C1, C2, and C5 are pulse signals, the amplitudes thereof are changed within a single cycle in a normal state. On the other hand, in an abnormal state, the amplitude change of the control signals C1, C2, and C5 is not observed over a single cycle or the amplitudes thereof are not changed for a certain period of time or longer. When it is determined that at least one of the control signals C1, C2, and C5 is in the abnormal state, the control unit 94A is controlled to stop the output of the control signals C1, C2, and C5 or all of the control signals.

Further, the output monitoring unit 94*c* is configured to monitor frequencies and duty ratios of the control signals C1, C2, and C5 outputted from the control unit 94A. The control unit 94A compares the frequencies of the control signals C1, C2, and C5 with a frequency designated by an input instruction value from the main controller 100. As a result of the comparison, if it is determined that there is a difference equal to or more than a preset critical value between at least one of the frequencies of the control signals C1, C2, and C5 and the designated frequency, the control unit 94A is controlled to stop the output of the control signals C1, C2, and C5 or all of the control signals.

Furthermore, the control unit 94A compares the duty ratios of the control signals C1, C2, and C5 with a duty ratio designated by an input instruction value from the main controller 100. As a result of the comparison, if it is determined that there is a difference equal to or more than a preset critical value between at least one of the duty ratios of the control signals C1, C2, and C5 and the designated duty ratio, the control unit 94A is controlled to stop the output of the control signals C1, C2, and C5 or all of the control signals.

In accordance with the power supply system 90A having the above-described configuration, if it is determined that the high frequency power and the DC voltage supplied from each power supply cannot be maintained in a preset state, it is possible to stop supplying the power or the voltage, and also possible to stop operating the plasma etching apparatus.

Further, in the present example embodiment, the control unit 94A compares a phase difference between the control signal C1 and the control signal C5 with a phase difference designated by an input instruction value from the main controller 100. As a result of the comparison, if it is determined that there is a difference equal to or more than a preset critical value between the phase difference between the control signal C1 and the control signal C5 and the designated phase difference, the control unit 94A is controlled to stop the output of the control signal C1 and the control signal C5, or all of the control signals. Herein, if two control signals are synchronized, a designated phase difference is zero. Further, the control unit 94A compares a phase difference between the control signal C1 and the control signal C2 with the phase difference designated by an input instruction value from the main controller 100. As a result of the comparison, if it is determined that there is a difference equal to or more than a preset critical value between these phase differences, the control unit 94A may be controlled to stop the output of the control signal C1 and the control signal C2, or all of the control signals. Furthermore, the control unit 94A compares a phase difference between the control signal C2 and the control signal C5 with the phase difference designated by an input instruction value from the main controller 100. As a result of the comparison, if it is determined that there is a difference equal to or more than a preset critical value between these phase differences, the control unit 94A may be controlled to stop the output of the control signal C2 and the control signal C5, or all of the control signals.

Further, the output monitoring unit 92b may further monitor an intensity of an output signal of the first high frequency power supply 92A during the period A1. In this case, if there is a preset difference or higher between the monitored intensity and a predetermined value, the first high frequency power supply 92A may stop the output of the first high frequency power.

Figure 17:
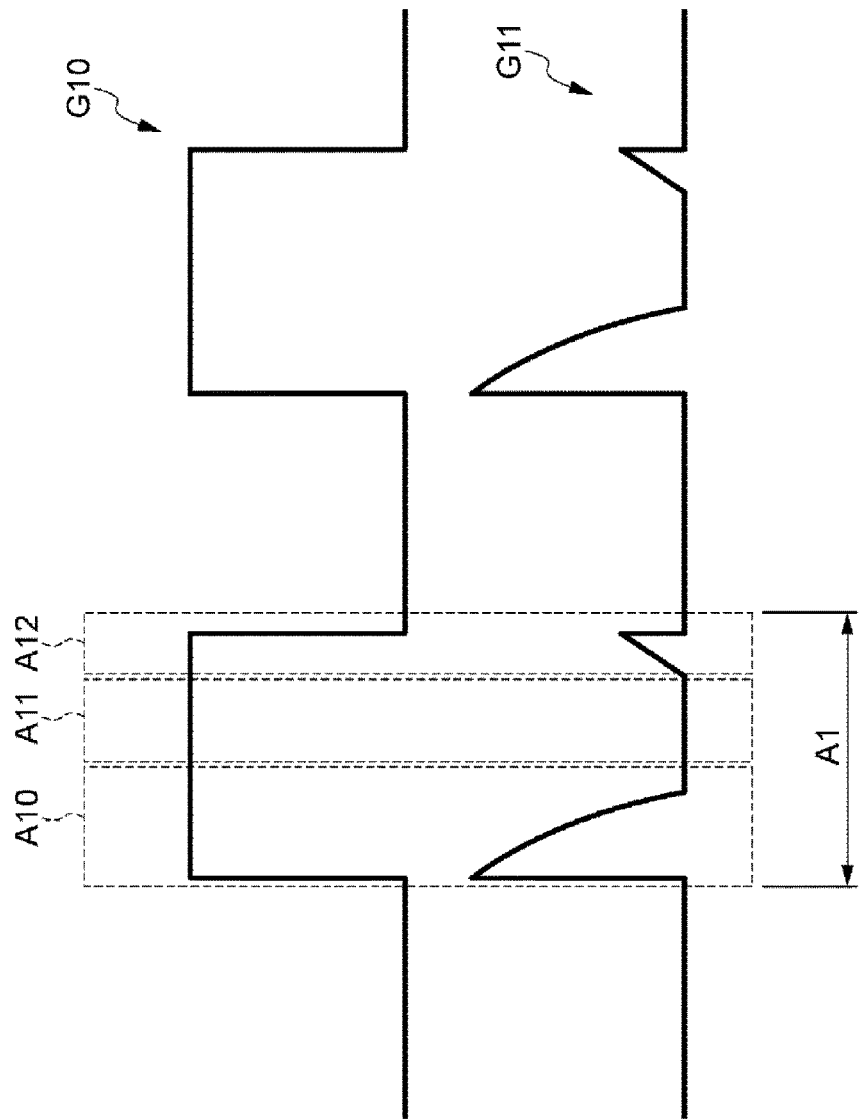
FIG. 17 is a diagram for showing a component included in a signal monitored by an output monitoring unit.

Herein, the intensity monitored by the output monitoring unit 92b includes an output signal component (see a waveform G10) from the first high frequency power supply 92A and a component (see a waveform G11) based on a reflection wave from the matching unit 97, as shown in FIG. 17. This reflection wave is remarkable particularly during a period (period A10) from the timing of starting an output signal from the first high frequency power supply 92A and during a period (period A12) between the timing before stopping the output signal and the timing of stopping the output signal. Therefore, the output monitoring unit 92b is configured to monitor an intensity of a period A11 set between the period A10 and the period A12 among intensities of the output signals from the first high frequency power supply 92A during the period A1. In the present example embodiment, the period A11 may be set such that a sum of the period A10 and the period A12 is 40% to 80% of the period A1.

Likewise, the output monitoring unit 93b may further monitor an intensity of an output signal of the second high frequency power supply 93A during the period A1. In this case, if there is a preset difference or higher between the monitored intensity and a predetermined value, the second high frequency power supply 93A may stop the output of the second high frequency power. Further, the intensity monitored by the output monitoring unit 93b may be acquired from the period A11 during the period A1. In accordance with the high frequency power supplies 92A and 93A including the output monitoring units 92b and 93b, respectively, it is possible to perform a control operation based on a highly reliable monitored value, so that unnecessary stops of the output from the high frequency power supplies 92A and 93A can be suppressed.

Various example embodiments have been explained above, but are not limited thereto, and may include various modification examples. By way of example, the control unit 94 may be configured to change frequencies of the control signals C1, C2, and C5 during the etching process. In this modification example, an optimum amount of electrons, which depends on an etching status of the semiconductor wafer W serving as a target substrate, can be irradiated to the semiconductor wafer W.

Hereinafter, the modification example will be explained in more detail based on experimental examples and comparative examples, but is not limited to the following experimental examples.

In experimental examples 1 to 4, the switch circuit 105 of the power supply system 90 is closed to connect the discharging circuit 104 with the node 109, and a voltage of the first DC power supply unit 101 is set to about −150 V and a second DC voltage of the second DC power supply unit 102 is set to about −1000 V. Further, the resistance elements 106c and 107c of about 50Ω, the capacitors 106a, 106b, 107a, and 107b each having a capacity of about 0.66 µF, and the resistance element Rs of about 200Ω are used. Further, in the experimental examples 1 to 4, the control signals C5 having frequencies of about 10 kHz, about 20 kHz, about 30 kHz, and about 40 kHz are respectively supplied from the control unit 94 to the DC power supply 91. Furthermore, in the experimental examples 1 to 4, the duty ratio of the control signal C5, i.e., the ratio of the period A1 to a sum of the period A1 and the period A2 is set to about 80%. Moreover, in a comparative example, the switch circuit 105 of the power supply system 90 is opened to disconnect the discharging circuit 104 from the node 109. The other conditions in the comparative example are the same as those in the experimental example 2. Further, in the experimental examples 1 to 4 and the comparative example, the waveforms of the output voltages from the DC power supply 91 are checked. As a result thereof, in the comparative example, the output voltage from the DC power supply 91 during the period A1 is about −164 V, and thus, cannot be controlled to be about −150 V. In the experimental examples 1 to 4, it is confirmed that the output voltages from the DC power supply 91 during the period A1 are controlled to be about −150 V.

Further, in experimental examples 5 to 8, the etching selectivity is checked using the plasma etching apparatus 1 including the DC power supply 91 in which the discharging circuit 104 is connected with the node 109. The processing conditions in the experimental examples 5 to 8 are as shown in FIG. 18. That is, as shown in FIG. 18, among the processing conditions in the experimental examples 5 to 8, only frequencies of the control signals C1, C2, and C5 are different. Further, in the experimental examples 5 to 8, a contact hole having a width of about 33 nm is formed at a SiN layer of the semiconductor wafer W including an ArF resist film on the SiN layer as an etching mask. Furthermore, in the experimental examples 5 to 8, the etching selectivity of the SiN layer to the ArF resist film is obtained. As can be clearly seen from the etching selectivity in the experimental examples 5 to 8 shown in FIG. 18, by setting the frequencies of the control signals C1, C2, and C5 to be high, i.e., by setting a cycle of switching the DC voltages applied to the upper electrode to be shortened, it is possible to improve the etching selectivity, and also possible to improve the modification effect on the ArF resist film.

EXPLANATION OF REFERENCE NUMERALS

1: Plasma etching apparatus
10: Processing chamber
16: Lower electrode
34: Upper electrode
66: Gas supply source
90: Power supply system
91: DC power supply
92: First high frequency power supply
93: Second high frequency power supply
94: Controller
101: First DC power supply unit
102: Second DC power supply unit
104: Discharging circuit
105: Switch circuit
109: Node
140: Current limiting circuit
A1 to A4: Periods
C1: Control signal (First control signal)
C2: Control signal
C5: Control signal (Second control signal)
Rs: Resistance element
V1: First DC voltage
V2: Second DC voltage
W: Semiconductor wafer

We claim:

1. A power supply system in a plasma etching apparatus in which a lower electrode included in a mounting table that mounts a target substrate thereon and an upper electrode facing the lower electrode are provided within a processing chamber, the power supply system comprising:
a high frequency power supply which is electrically connected with the lower electrode and configured to generate a high frequency power for plasma generation;
a DC power supply, configured to apply an output voltage as a negative DC voltage to the upper electrode, having a first DC power supply unit configured to supply a first negative DC voltage, a second DC power supply unit configured to supply a second negative DC voltage having a higher absolute value than that of the first negative DC voltage, and a selecting circuit configured to selectively connect the first DC power supply unit and the second DC power supply unit to the upper electrode; and
a control unit configured to control the high frequency power supply and the DC power supply,
wherein the control unit is configured to alternately repeat an output of the high frequency power and a stop of the output thereof at a certain frequency by outputting a first control signal to the high frequency power supply,
the control unit is configured to connect the first DC power supply unit to the upper electrode during a period where the high frequency power is outputted and connect the second DC power supply unit to the upper electrode during a period where the output of the high frequency power is stopped by outputting a second control signal to the DC power supply,
the DC power supply further includes a discharging circuit connected with a node between the first DC power supply unit and the selecting circuit, and a switch circuit provided between the discharging circuit and the node,
the control unit is configured to control the switch circuit such that the switch circuit is closed when alternation between the first DC power supply unit being connected with the upper electrode and the second DC power supply unit being connected with the upper electrode occurs, and the switch circuit is opened when only one of the first DC power supply unit and the second DC power supply unit is continuously connected with the upper electrode, and
the discharging circuit is configured to discharge electric charges accumulated in the processing chamber to a ground potential when the DC power supply unit connected with the upper electrode is switched from the second DC power supply unit to the first DC power supply unit.

2. The power supply system of claim 1,
wherein the discharging circuit includes a resistance element.

3. The power supply system of claim 2,
wherein the discharging circuit serves as a current limiting circuit configured to limit a value of a current flowing through the resistance element.

4. The power supply system of claim 1,
wherein the first control signal is a pulse signal configured to switch between the output of the high frequency power and the stop of the output thereof, and the second control signal is a pulse signal configured to switch the DC power supply unit connected with the upper electrode between the first DC power supply unit and the second DC power supply unit, and
the control unit is configured to control frequencies and duty ratios of the first control signal and the second control signal and configured to control a phase difference between the first control signal and the second control signal.

5. The power supply system of claim 1,
wherein the control unit is configured to monitor the first control signal and the second control signal outputted from the control unit, and the control unit is configured to stop the outputs of the first control signal and the second control signal when the first control signal and the second control signal contain preset abnormalities.

6. The power supply system of claim 1,
wherein the DC power supply is configured to monitor the inputted second control signal, and the DC power supply stops the output of the output voltage when the second control signal contains a preset abnormality.

7. The power supply system of claim 1,
wherein the second control signal is a pulse signal configured to switch the DC power supply unit connected with the upper electrode between the first DC power supply unit and the second DC power supply unit, and the DC power supply compares the output voltage from the DC power supply with the inputted second control signal, and the DC power supply stops the output of the output voltage when there is a difference equal to or higher than a preset value between a frequency of the output voltage and a frequency of the second control signal or when there is a difference equal to or higher than a preset value between a duty ratio of the output voltage and a duty ratio of the second control signal.

8. The power supply system of claim 1,
wherein the high frequency power supply monitors the inputted first control signal, and the high frequency power supply stops the output of the high frequency power when the first control signal contains a preset abnormality.

9. The power supply system of claim 8,
wherein the high frequency power supply monitors the high frequency power from the high frequency power supply during a period set between a preset period from when the output of the high frequency power is started and a preset period from the timing before the output of the high frequency power is stopped and to the timing when the output of the high frequency power is stopped in the period where the high frequency power is outputted, and the high frequency power supply controls the output of the high frequency power based on the monitored high frequency power.

10. The power supply system of claim 1,
wherein the first control signal is a pulse signal configured to switch between the output of the high frequency power and the stop of the output thereof, and
the high frequency power supply compares the high frequency power from the high frequency power supply with the inputted first control signal, and the high frequency power supply stops the output of the high frequency power when there is a difference equal to or higher than a preset value between a frequency of the high frequency power and a frequency of the first control signal or when there is a difference equal to or higher than a preset value between a duty ratio of the high frequency power and a duty ratio of the first control signal.

11. A plasma etching apparatus comprising:
a processing chamber;
a gas supply unit configured to supply a processing gas into the processing chamber;
a mounting table, configured to mount a target substrate thereon, having a lower electrode;
an upper electrode which is provided within the processing chamber to face the lower electrode; and
a power supply system claimed in claim 1.

\* \* \* \* \*